(12) United States Patent
Ogasawara et al.

(10) Patent No.: US 8,212,887 B2
(45) Date of Patent: Jul. 3, 2012

(54) SOLID-STATE IMAGE PICKUP DEVICE WITH OPTICAL COMMUNICATION UNIT AND COOLING UNIT

(75) Inventors: Hidehiko Ogasawara, Chiba (JP); Toshiyuki Sekiya, Tokyo (JP)

(73) Assignee: Sony Corporation, Tokyo (JP)

( * ) Notice: Subject to any disclaimer, the term of this patent is extended or adjusted under 35 U.S.C. 154(b) by 345 days.

(21) Appl. No.: 12/565,369

(22) Filed: Sep. 23, 2009

(65) Prior Publication Data

US 2010/0091151 A1 Apr. 15, 2010

(30) Foreign Application Priority Data

Oct. 10, 2008 (JP) ................. 2008-264582

(51) Int. Cl.
*H04N 5/228* (2006.01)
*H04N 5/235* (2006.01)
*H04N 5/225* (2006.01)

(52) U.S. Cl. .............. 348/222.1; 348/230.1; 348/340; 348/359

(58) Field of Classification Search .............. None
See application file for complete search history.

(56) References Cited

U.S. PATENT DOCUMENTS

| 6,961,092 B1 * | 11/2005 | Kakiuchi et al. ......... 348/370 |
| 2002/0070739 A1 * | 6/2002 | Dishongh et al. ......... 324/752 |
| 2004/0140417 A1 * | 7/2004 | Karin ................... 250/208.1 |
| 2006/0240586 A1 * | 10/2006 | Kobayashi et al. ........ 438/26 |

FOREIGN PATENT DOCUMENTS

| JP | 2004-112422 | 4/2004 |
| JP | 2004-219882 | 8/2004 |
| JP | 2006-191465 | 7/2006 |
| JP | 2006-196972 | 7/2006 |

OTHER PUBLICATIONS

U.S. Appl. No. 12/554,506, filed Sep. 4, 2009, Ogasawara, et al.
U.S. Appl. No. 12/555,235, filed Sep. 8, 2009, Ogasawara, et al.
U.S. Appl. No. 12/565,369, filed Sep. 23, 2009, Ogasawara, et al.
U.S. Appl. No. 12/572,637, filed Oct. 2, 2009, Ogasawara, et al.
U.S. Appl. No. 12/572,452, filed Oct. 2, 2009, Ogasawara, et al.

* cited by examiner

*Primary Examiner* — Albert Cutler
(74) *Attorney, Agent, or Firm* — Oblon, Spivak, McClelland, Maier & Neustadt, L.L.P.

(57) ABSTRACT

A solid-state image pickup device includes a pixel unit configured to convert light into an electrical signal; a substrate having a first side on which the pixel unit is formed and a second side opposite the first side; an optical communication unit disposed on the first side of the substrate, and configured to convert a signal read out from the pixel unit into an optical signal and output the optical signal; and a cooling unit disposed on the second side of the substrate and below at least a forming area of the optical communication unit, the forming area being an area where the optical communication unit is formed, and configured to cool or dissipate heat generated in the optical communication unit and transferred through the substrate.

11 Claims, 13 Drawing Sheets

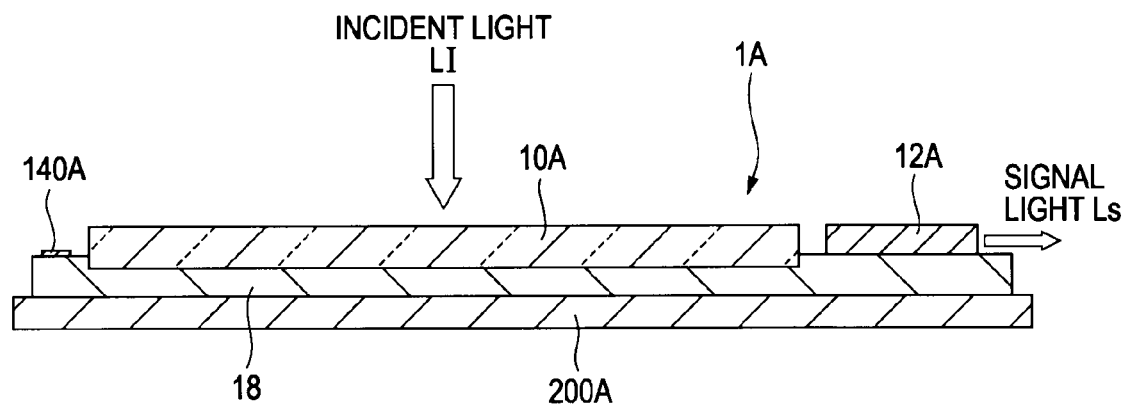
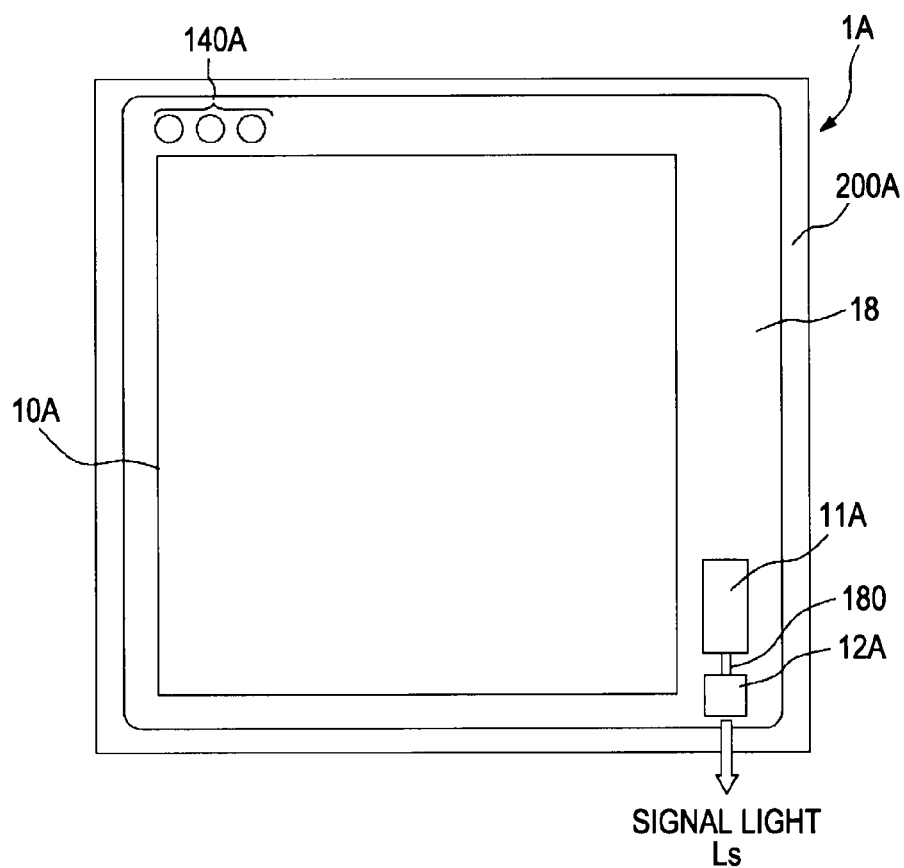

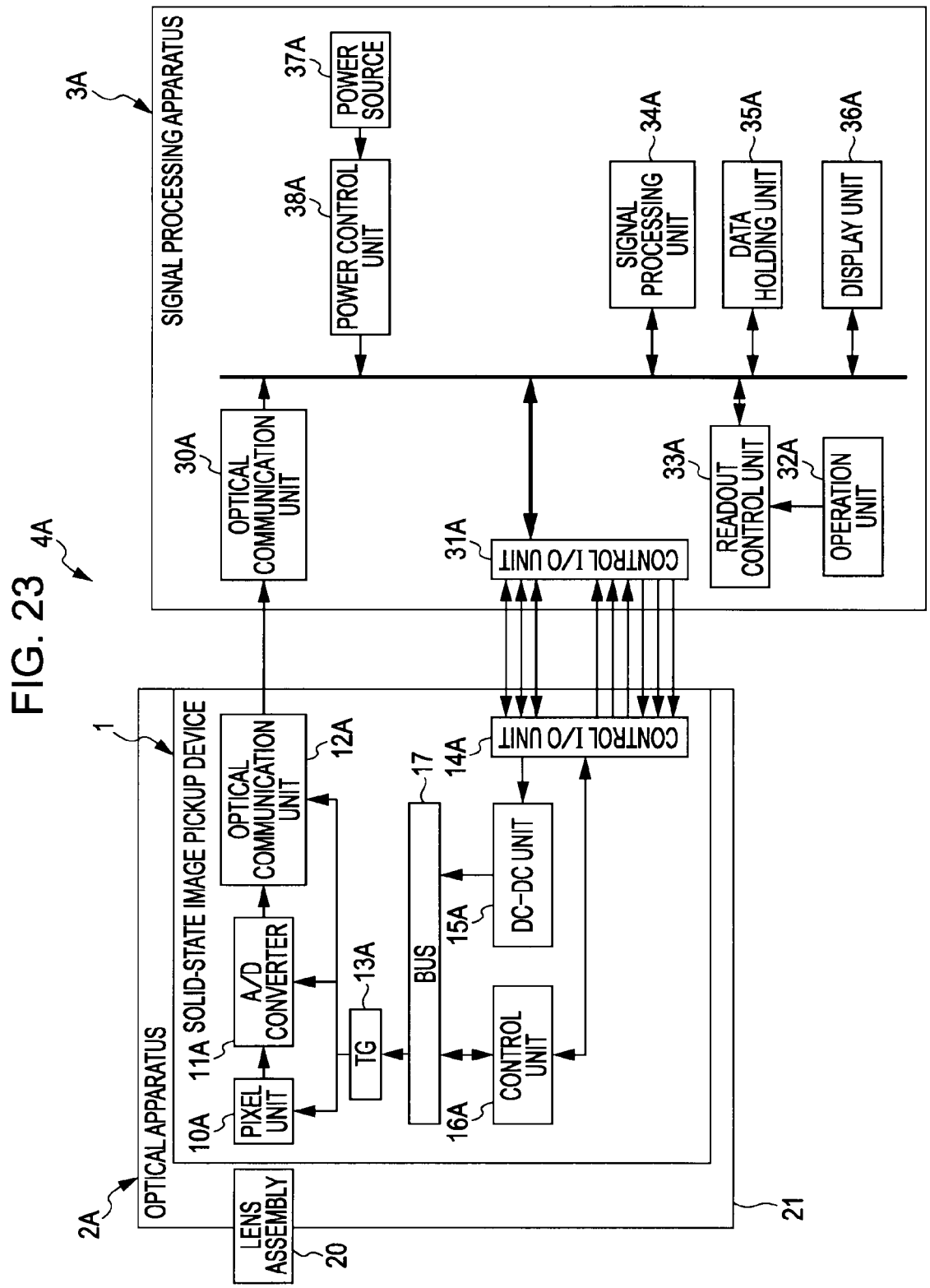

SOLID-STATE IMAGE PICKUP DEVICE WITH OPTICAL COMMUNICATION UNIT AND COOLING UNIT

BACKGROUND OF THE INVENTION

1. Field of the Invention

The present invention relates to a solid-state image pickup device that converts an optical image into an electrical signal, and also relates to a signal processing system including the solid-state image pickup device. In particular, the present invention relates to a technique for allowing a pixel signal read out from a solid-state image pickup device to be output as an optical signal.

2. Description of the Related Art

In a solid-state image pickup device configured to convert an image of incident light into an electrical signal and output the electrical signal, an electrical signal read out from an image sensor is externally output through electrical wiring, such as wire bonding.

For such a solid-state image pickup device, there is proposed a technique which allows an image sensor to be cooled by a Peltier element disposed on a lower surface of a signal processing device, the lower surface being a surface on which the image sensor is formed (e.g., see Japanese Unexamined Patent Application Publication No. 2006-191465).

As the speed and degree of integration of circuit boards increase, it has become necessary to quickly respond to problems, such as signal delay and electromagnetic interference (EMI). Optical interconnection technology that not only allows high-speed transmission, but also solves problems associated with electrical wiring has attracted attention. The problems associated with electrical wiring include signal delay, signal degradation, and electromagnetic interference noise radiated from wires.

A technique based on the optical interconnection technology described above is proposed. In this proposed technique, a lens configured to be attachable to and removable from a camera body is provided with a solid-state image pickup device, and a signal output from the solid-state image pickup device can be optically transmitted to the camera body (e.g., see Japanese Unexamined Patent Application Publication No. 2006-196972).

SUMMARY OF THE INVENTION

In the technique described in Japanese Unexamined Patent Application Publication No. 2006-191465, an electrical signal read out from the image sensor is externally output through electrical wiring, such as wire bonding. Therefore, as the speed of signal transmission increases, the level of signal degradation caused by electromagnetic noise etc. increases.

Using the optical interconnection technology makes it possible to achieve high-speed transmission of a signal output from the solid-state image pickup device. However, a light emitting element used in the optical interconnection technology generates heat. Japanese Unexamined Patent Application Publication No. 2006-196972 discloses a configuration in which a light emitting element is mounted on a substrate on which the solid-state image pickup device is mounted, but gives no description about a technique for cooling the light emitting element. It is thus difficult to give consideration as to how the heat generated from the light emitting element may affect the solid-state image pickup device.

Accordingly, it is desirable to provide a solid-state image pickup device capable of allowing a pixel signal read out from a pixel unit to be transmitted as an optical signal at high speed and reducing the effect of heat caused by optical communication, and also to provide a signal processing system including the solid-state image pickup device.

A solid-state image pickup device according to an embodiment of the present invention includes a pixel unit configured to convert light into an electrical signal; a substrate having a first side on which the pixel unit is formed and a second side opposite the first side; an optical communication unit disposed on the first side of the substrate, and configured to convert a signal read out from the pixel unit into an optical signal and output the optical signal; and a cooling unit disposed on the second side of the substrate and below at least a forming area of the optical communication unit, the forming area being an area where the optical communication unit is formed, and configured to cool or dissipate heat generated in the optical communication unit and transferred through the substrate.

A signal processing system according to another embodiment of the present invention includes the solid-state image pickup device described above. That is, the signal processing system includes an optical apparatus including a solid-state image pickup device that converts incident light into an electrical signal, and an optical device that causes light to be incident on the solid-state image pickup device; and a signal processing apparatus to which the optical apparatus is connected. The solid-state image pickup device includes a pixel unit configured to convert light into an electrical signal; a substrate having a first side on which the pixel unit is formed and a second side opposite the first side; an optical communication unit disposed on the first side of the substrate, and configured to convert a signal read out from the pixel unit into an optical signal and output the optical signal; and a cooling unit disposed on the second side of the substrate and below at least a forming area of the optical communication unit, the forming area being an area where the optical communication unit is formed, and configured to cool or dissipate heat generated in the optical communication unit and transferred through the substrate.

According to the above-described embodiments of the present invention, an electrical signal obtained by photoelectric conversion of light incident on the pixel unit is read out, input to the optical communication unit, converted into an optical signal, and output as signal light. Heat generated in the optical communication unit is transferred through the substrate to the cooling unit disposed immediately below the substrate, and cooled or dissipated by the cooling unit.

In a solid-state image pickup device according to an embodiment of the present invention, an optical communication unit is disposed on a front side of a substrate, the front side being a side where a pixel unit is formed, while a cooling unit is disposed on a back side of the substrate. Since the pixel unit, the optical communication unit, and processing units and signal wires for reading out signals are formed on the front side of the substrate, the cooling unit that provides a desired level of cooling efficiency can be disposed on the back side of the substrate in accordance with the arrangement of the optical communication unit etc.

Thus, heat generated in the optical communication unit on the front side of the substrate can be efficiently cooled by the cooling unit disposed in a large area on the back side of the substrate. Moreover, when the cooling unit is disposed on the entire back side of the substrate, since the cooling unit is located below the forming area of the pixel unit, it is possible to uniformly cool the pixel unit and thus to provide uniform pixel characteristics.

Additionally, since the degree of freedom of arrangement of the cooling unit is improved, it is possible to adopt various cooling methods, such as a method in which optical communication units are arranged in a centralized manner and cooled together, and a method in which optical communication units are arranged in a distributed manner so that heat sources are separated and cooled.

BRIEF DESCRIPTION OF THE DRAWINGS

FIG. 1 is a schematic cross-sectional view illustrating an example of a solid-state image pickup device according to a first embodiment of the present invention.

FIG. 2 is a schematic plan view of the solid-state image pickup device illustrated in FIG. 1.

FIG. 23 is a functional block diagram illustrating an overview of a signal processing system including a solid-state image pickup device.

DESCRIPTION OF THE PREFERRED EMBODIMENTS

Figure 3:
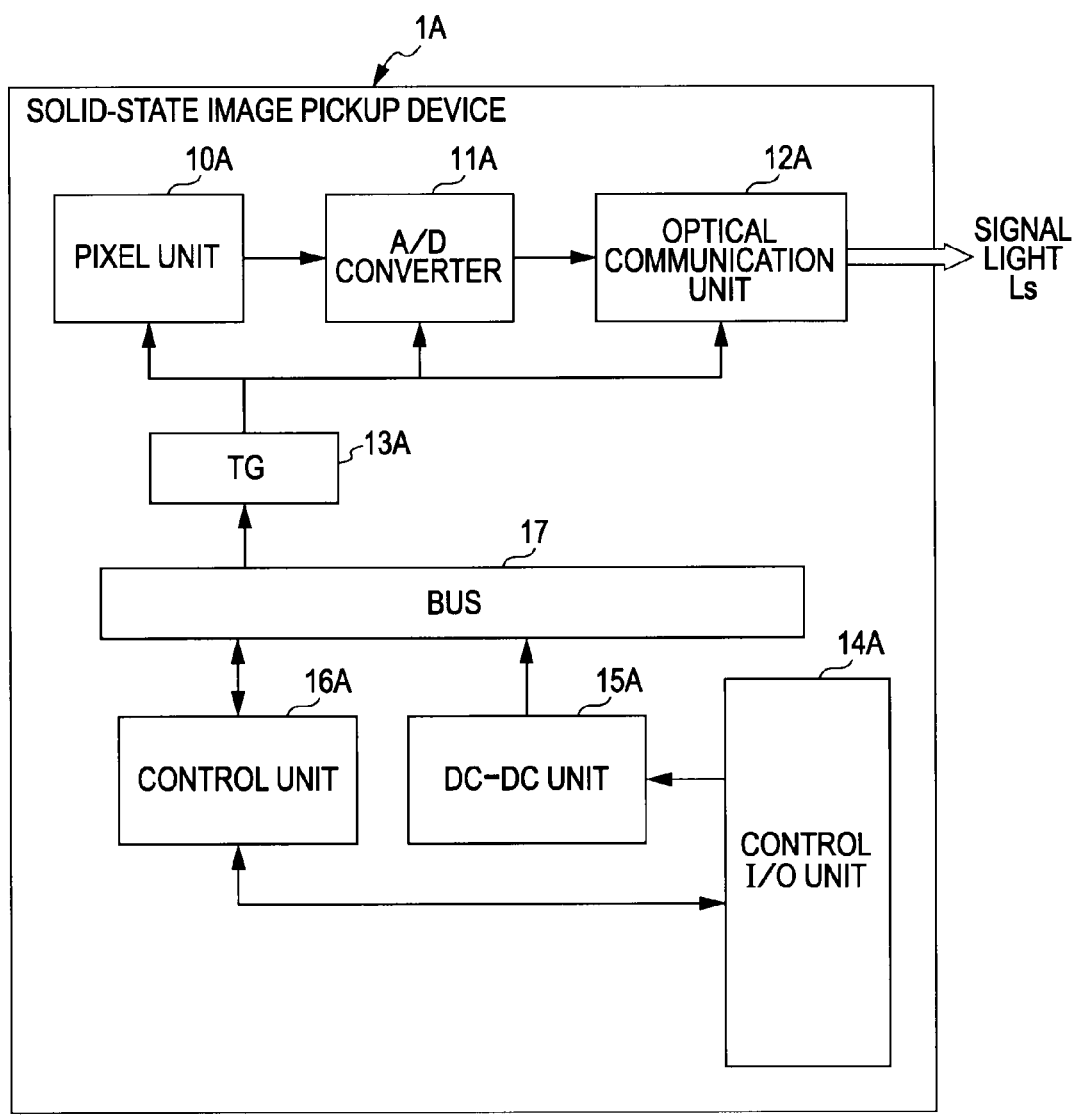
FIG. 3 is a functional block diagram illustrating an example of a functional configuration for realizing a solid-state image pickup device according to each embodiment of the present invention.

Hereinafter, with reference to the accompanying drawings, a description will be given about a solid-state image pickup device, an optical apparatus including the solid-state image pickup device, a signal processing apparatus to which the optical apparatus is connected, and a signal processing system including the optical apparatus and the signal processing apparatus according to embodiments of the present invention.
Exemplary Configuration of Solid-State Image Pickup Device of First Embodiment FIG. 1 is a schematic cross-sectional view illustrating an example of a solid-state image pickup device according to a first embodiment of the present invention. FIG. 2 is a schematic plan view of the solid-state image pickup device illustrated in FIG. 1. FIG. 3 is a functional block diagram illustrating an example of a functional configuration for realizing a solid-state image pickup device according to each embodiment of the present invention.

A solid-state image pickup device 1A of the first embodiment is a complementary metal oxide semiconductor (CMOS) image sensor or a charge-coupled device (CCD) image sensor. The solid-state image pickup device 1A includes a pixel unit 10A that converts light into an electrical signal and outputs the electrical signal. In the pixel unit 10A, pixels that convert light into electricity are two-dimensionally or one-dimensionally arranged. The pixel unit 10A outputs an electrical signal corresponding to intensity of light LI incident on the pixels.

The solid-state image pickup device 1A includes an analog-to-digital (A/D) converter 11A and an optical communication unit 12A. The A/D converter 11A converts an electrical signal output from the pixel unit 10A into a digital signal. The optical communication unit 12A converts an electrical signal output from the A/D converter 11A as a digital signal into an optical signal and outputs the optical signal.

The optical communication unit 12A includes one or more optical output parts that convert an electrical signal into an optical signal. As a first embodiment of the optical output part, the optical communication unit 12A includes a self-luminous light emitting element, such as a semiconductor laser (LD), that emits light in response to a voltage applied thereto. The light emitting element, such as a semiconductor laser, is capable of modulating light with an electrical signal produced by changes in applied voltage etc. Thus, the optical communication unit 12A modulates self-emitted light on the basis of an electrical signal converted into a digital signal by the A/D converter 11A, and outputs signal light Ls based on pixel data read out from the pixel unit 10A.

As a second embodiment of the optical output part, the optical communication unit 12A includes an optical modulator. On the basis of an electrical signal produced by changes in voltage etc., the optical modulator externally modulates light that is externally input and transmitted or reflected. In the optical communication unit 12A, a certain amount of external light is input to the optical modulator, and an electrical signal converted into a digital signal by the A/D converter 11A is also input to the optical modulator. Thus, the optical communication unit 12A modulates the externally input light on the basis of the electrical signal input from the A/D converter 11A, and outputs signal light Ls based on pixel data read out from the pixel unit 10A.

The solid-state image pickup device 1A includes a timing generator (TG) 13A that generates a drive clock (CLK) corresponding to an operation mode. The timing generator 13A supplies the drive clock to each of functional blocks, that is, to the pixel unit 10A, the A/D converter 11A, and the optical communication unit 12A. The solid-state image pickup device 1A further includes a control input/output (I/O) unit 14A that inputs and outputs a control signal etc., a direct current-to-direct current (DC-DC) unit 15A that supplies power, and a control unit 16A that controls readout of pixel data. The control unit 16A, the DC-DC unit 15A, and the timing generator 13A are connected to the bus 17 to transmit and receive a control signal and data.

The control unit 16A controls the DC-DC unit 15A to turn on and off the power of the solid-state image pickup device 1A. The control unit 16A causes the timing generator 13A to generate a drive clock and supply the drive clock to the pixel unit 10A, the A/D converter 11A, and the optical communication unit 12A, so that the pixel unit 10A, the A/D converter 11A, and the optical communication unit 12A operate in synchronization with the drive clock.

The pixel unit 10A, the A/D converter 11A, and the optical communication unit 12A use a drive clock supplied from the timing generator 13A to synchronize signal input and output. In the pixel unit 10A, pixel data corresponding to an image of incident light is read out as an electrical signal. The A/D converter 11A inputs the pixel data read out from the pixel unit 10A, converts the pixel data into a digital signal, and outputs the digital signal. The optical communication unit 12A inputs an electrical signal read out from the pixel unit 10A and converted by the A/D converter 11A into a digital signal, converts the electrical signal into an optical signal based on pixel data, and outputs signal light Ls.

The solid-state image pickup device 1A includes a silicon (Si) substrate 18 on which the pixel unit 10A, the A/D converter 11A, the optical communication unit 12A, the timing generator 13A, the DC-DC unit 15A, and the control unit 16A are formed in an integrated manner. The solid-state image pickup device 1A is produced in a semiconductor manufacturing process as a single chip on which the above-described components are formed in an integrated manner.

In the solid-state image pickup device 1A, the pixel unit 10A is disposed on one side (first side) of the substrate 18. Light is incident on the pixel unit 10A from the first side of the substrate 18. The A/D converter 11A, the DC-DC unit 15A, and the control unit 16A that input and output an electrical signal and power from and to the pixel unit 10A are disposed on the first side of the substrate 18. The optical communication unit 12A is also disposed on the first side of the substrate 18.

In the solid-state image pickup device 1A, processing units are disposed on a front side of the substrate 18, so that electrical signal transmission is all performed on the front side of the substrate 18. In the solid-state image pickup device 1A, the optical communication unit 12A is disposed on the output end of the A/D converter 11A. The A/D converter 11A and the optical communication unit 12A are connected to each other through a signal wire 180. Thus, the length of wire through which a digital signal produced by A/D conversion is transmitted as an electrical signal can be reduced.

In the solid-state image pickup device 1A, a pixel signal read out from the pixel unit 10A as an electrical signal is converted into a digital signal by the A/D converter 11A, and supplied through the signal wire 180 to the optical communication unit 12A. The pixel signal read out from the pixel unit 10A is converted into signal light Ls by the optical communication unit 12A and output.

Thus, in the solid-state image pickup device 1A, a data line through which a pixel signal converted into a digital signal is transmitted can be realized by a transmission channel based on optical communication, and thus high-speed signal transmission can be achieved. For example, producing a serialized digital signal by superimposing a synchronization signal and a clock signal on a pixel signal makes it possible to realize optical signal transmission on a single channel. With a configuration in which serialized pixel and clock signals are transmitted on independent channels, optical signal transmission can be performed on a plurality of (two) channels.

In the solid-state image pickup device 1A, an electrode pad 140A serving as an electrode unit and connected to the control I/O unit 14A is formed on the front side of the substrate 18. Since a pixel signal is transmitted by optical communication, it is not necessary for the solid-state image pickup device 1A to be provided with an electrode pad for externally transmitting a pixel signal as an electrical signal. Therefore, the electrode pad 140A includes at least three lines, a power supply line, a GND line, and a control line.

The solid-state image pickup device 1A includes a cooling unit 200A on the entire back side of the substrate 18. The cooling unit 200A is made of higher thermal conductivity material than the substrate 18 etc. The cooling unit 200A externally dissipates heat generated in the optical communication unit 12A etc. and transferred to the substrate 18, and thereby allows the optical communication unit 12A etc. to be naturally cooled. The cooling unit 200A may be capable of forcibly cooling the optical communication unit 12A etc. with a fan or the like.

In the solid-state image pickup device 1A, as described above, the processing units are disposed on the front side of the substrate 18, so that electrical signal transmission is performed on the front side of the substrate 18. This means that the solid-state image pickup device 1A is configured such that no processing units and no signal wires are provided on the back side of the substrate 18. The cooling unit 200A on the entire back side of the substrate 18, for example, may have the same shape as that of the substrate 18, or may extend beyond each side of the substrate 18 depending on how the solid-state image pickup device 1A is mounted.

In the solid-state image pickup device 1A, the cooling unit 200A is disposed on the entire back side of the substrate 18. This means that the cooling unit 200A is disposed directly below the optical communication unit 12A and on the entire back side of a forming area of the optical communication unit 12A, the forming area being an area where the optical communication unit 12A is formed. Moreover, since the cooling unit 200A is in contact with the entire back side of the substrate 18, the cooling unit 200A and the substrate 18 are in contact with each other on the entire back side of the forming area of the optical communication unit 12A, that is, at a position directly below the optical communication unit 12A.

Heat generated in the optical communication unit 12A is transferred from the optical communication unit 12A to the substrate 18. Since the substrate 18 and the cooling unit 200A are in contact with each other directly below the optical communication unit 12A, the heat transferred from the optical communication unit 12A to the substrate 18 is further transferred to the cooling unit 200A directly below the optical communication unit 12A.

Thus, heat generated in the optical communication unit 12A can be efficiently transferred to the cooling unit 200A on the back side of the substrate 18, and the efficiency of cooling the optical communication unit 12A can be increased. It is thus possible to prevent heat generated in the optical communication unit 12A from reaching the pixel unit 10A through the substrate 18.

At the same time, the cooling unit 200A is disposed directly below the pixel unit 10A, so that the back side of the substrate 18 is in contact with the cooling unit 200A directly below the entire forming area of the pixel unit 10A. Thus, heat generated in the pixel unit 10A is transferred from the entire forming area of the pixel unit 10A through the substrate 18 to the cooling unit 200A. Therefore, it is possible to uniformly cool the pixel unit 10A or dissipate heat in the pixel unit 10A, and thus to provide uniform pixel characteristics.

Modifications of Solid-State Image Pickup Device of First Embodiment

Figure 4:
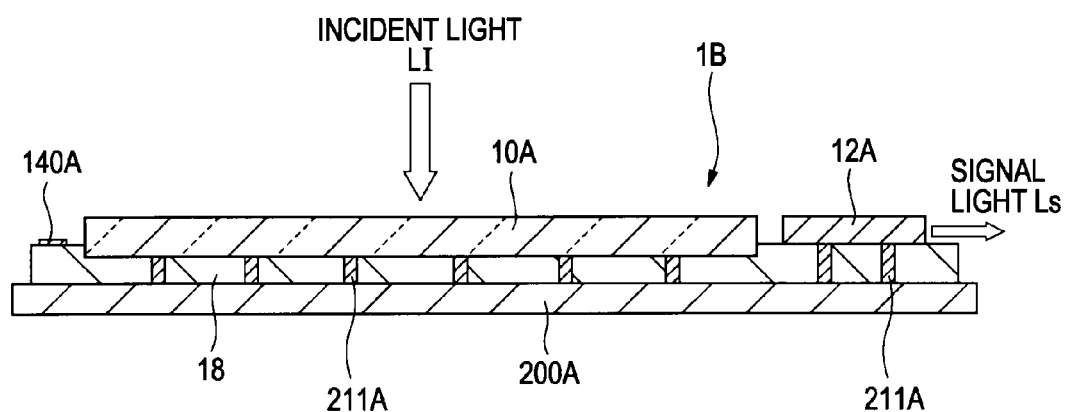
FIG. 4 is a schematic cross-sectional view illustrating a first modification of the solid-state image pickup device according to the first embodiment.

FIG. 4 is a schematic cross-sectional view illustrating a first modification of the solid-state image pickup device according to the first embodiment. In a solid-state image pickup device 1B according to the first modification of the first embodiment, as in the case of the solid-state image pickup device 1A of the first embodiment, processing units, such as the pixel unit 10A and the optical communication unit 12A, are disposed on the front side of the substrate 18. At the same time, the cooling unit 200A is disposed on the entire back side of the substrate 18.

The solid-state image pickup device 1B includes heat conducting parts 211A that connect the optical communication unit 12A and pixel unit 10A formed on the front side of the substrate 18 to the cooling unit 200A formed on the back side of the substrate 18. The substrate 18 is provided with through holes extending from the bottom of the optical communication unit 12A and pixel unit 10A to the cooling unit 200A. The heat conducting parts 211A are formed by metallizing the through holes with high thermal conductivity material.

In the solid-state image pickup device 1B, since the optical communication unit 12A, the pixel unit 10A, and the cooling unit 200A are in contact with the heat conducting parts 211A, the optical communication unit 12A and the pixel unit 10A are thermally connected to the cooling unit 200A.

One or a plurality of the heat conducting parts 211A are formed under the optical communication unit 12A and connected to the cooling unit 200A. At least one of the one or plurality of heat conducting parts 211A under the optical communication unit 12A is located directly below the heat source of the optical communication unit 12A. In the case of the pixel unit 10A, a plurality of the heat conducting parts 211A are arranged, for example, uniformly over the entire forming area of the pixel unit 10A and connected to the cooling unit 200A.

Thus, heat generated in the optical communication unit 12A can be efficiently transferred through the heat conducting parts 211A to the cooling unit 200A on the back side of the substrate 18, and the efficiency of cooling the optical communication unit 12A can be increased. It is thus possible to prevent heat generated in the optical communication unit 12A from reaching the pixel unit 10A through the substrate 18. At the same time, heat generated in the pixel unit 10A can be efficiently transferred to the cooling unit 200A on the back side of the substrate 18, and the efficiency of cooling the pixel unit 10A can be uniformly increased.

Figure 5:
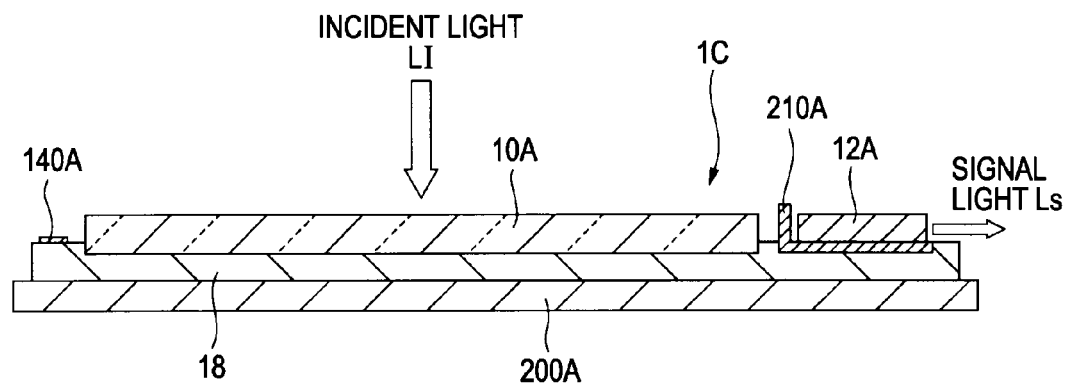
FIG. 5 is a schematic cross-sectional view illustrating a second modification of the solid-state image pickup device according to the first embodiment.
Figure 6:
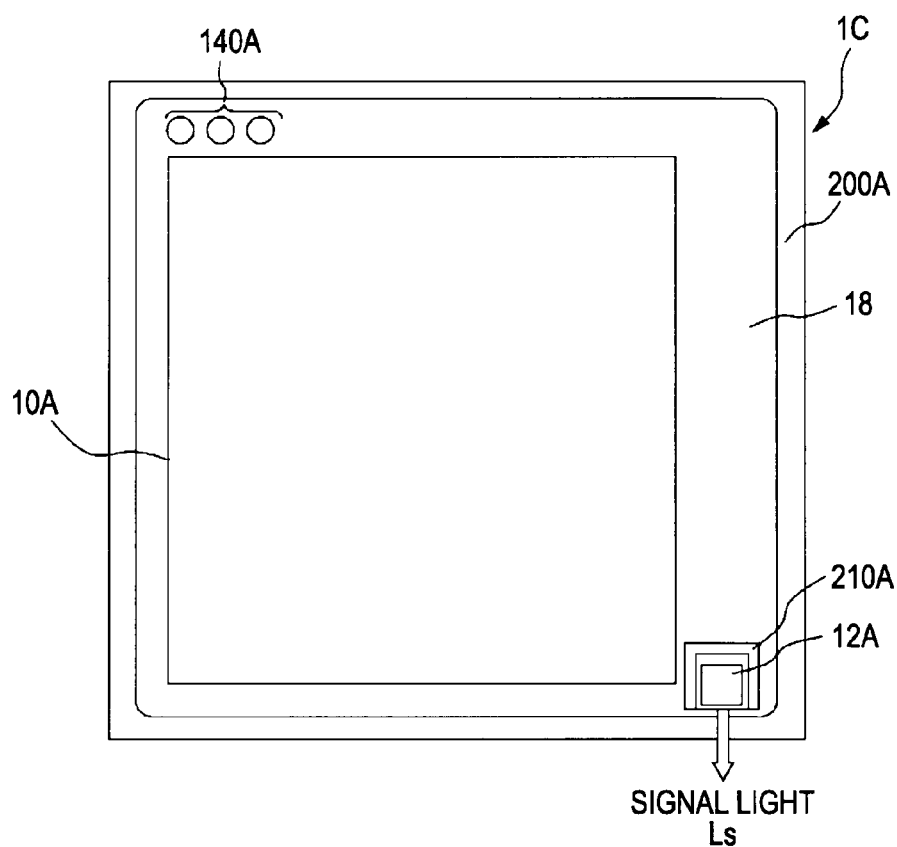
FIG. 6 is a schematic plan view of the solid-state image pickup device illustrated in FIG. 5.

FIG. 5 is a schematic cross-sectional view illustrating a second modification of the solid-state image pickup device according to the first embodiment. FIG. 6 is a schematic plan view of the solid-state image pickup device illustrated in FIG. 5. In a solid-state image pickup device 1C according to the second modification of the first embodiment, a cooling unit 210A is disposed around the optical communication unit 12A on the front side of the substrate 18.

The cooling unit 210A is made of higher thermal conductivity material than the substrate 18 etc. The cooling unit 210A externally dissipates heat generated in the optical communication unit 12A etc. to allow the optical communication unit 12A etc. to be naturally cooled. When the optical communication unit 12A includes a surface-emitting semiconductor laser as a light emitting element, the cooling unit 210A is configured, for example, as a plate-like member that covers the lower and side surfaces of the optical communication unit 12A, so as to surround the optical communication unit 12A except the upper surface which is a light-emitting surface of the optical communication unit 12A. When the optical communication unit 12A includes an end-face emitting semiconductor laser as a light emitting element, the cooling unit 210A is configured, for example, as a plate-like member that covers the lower surface and three side surfaces of the optical communication unit 12A, so as to surround the optical communication unit 12A except one side surface which is a light-emitting surface of the optical communication unit 12A. The cooling unit 210A is configured to be formed on an inner surface of the optical communication unit 12A, the inner surface facing toward the inside of the substrate 18 opposite the pixel unit 10A. The cooling unit 210A may be capable of forcibly cooling the optical communication unit 12A with a fan or the like.

Heat generated in the optical communication unit 12A is transferred from the optical communication unit 12A to the cooling unit 210A, and partially dissipated from the cooling unit 210A to the outside of the substrate 18. The remaining part of the heat generated in the optical communication unit 12A is transferred to the substrate 18. Since the substrate 18 is in contact with the cooling unit 200A directly below the optical communication unit 12A, the heat transferred from the optical communication unit 12A to the substrate 18 is further transferred from the substrate 18 to the cooling unit 200A directly below the optical communication unit 12A.

Thus, heat generated in the optical communication unit 12A can be dissipated by the cooling unit 210A on the front side of the substrate 18 and efficiently transferred to the cooling unit 200A on the back side of the substrate 18, and the efficiency of cooling the optical communication unit 12A can be increased. It is thus possible to prevent heat generated in the optical communication unit 12A from reaching the pixel unit 10A through the substrate 18.

Figure 7:
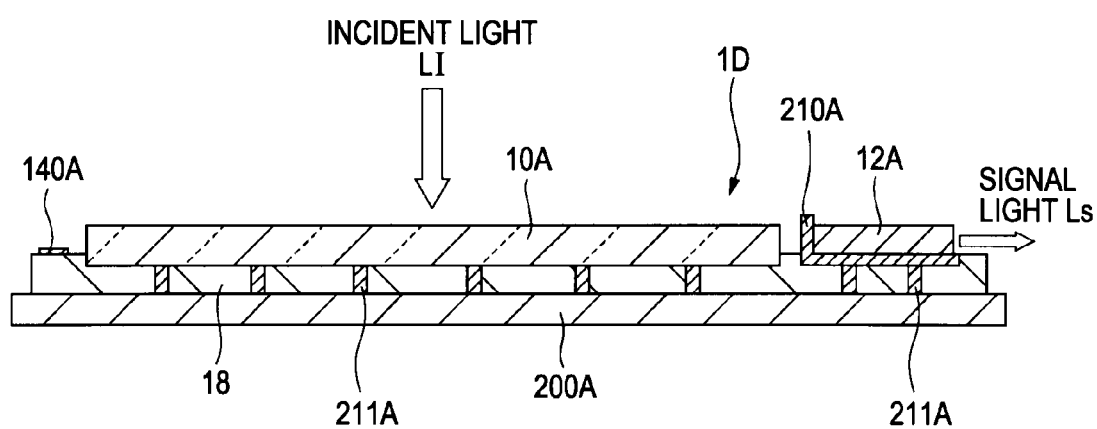
FIG. 7 is a schematic cross-sectional view illustrating a third modification of the solid-state image pickup device according to the first embodiment.

FIG. 7 is a schematic cross-sectional view illustrating a third modification of the solid-state image pickup device according to the first embodiment. In a solid-state image pickup device 1D according to the third modification of the first embodiment, the cooling unit 210A described above is disposed around the optical communication unit 12A on the front side of the substrate 18. Additionally, the solid-state image pickup device 1D includes the heat conducting parts 211A that connect the cooling unit 210A formed on the front side of the substrate 18 to the cooling unit 200A formed on the back side of the substrate 18. The heat conducting parts 211A also connect the pixel unit 10A to the cooling unit 200A.

In the solid-state image pickup device 1D, the cooling unit 210A formed on the lower surface of the optical communication unit 12A is connected through the heat conducting parts 211A to the cooling unit 200A on the back side of the substrate 18. Thus, heat generated in the optical communication unit 12A can be efficiently transferred from the cooling unit 210A through the heat conducting parts 211A to the cooling unit 200A on the back side of the substrate 18, and the efficiency of cooling the optical communication unit 12A can be increased. It is thus possible to prevent heat generated in the optical communication unit 12A from reaching the pixel unit 10A through the substrate 18.

Exemplary Configuration of Solid-State Image Pickup Device of Second Embodiment

Figure 8:
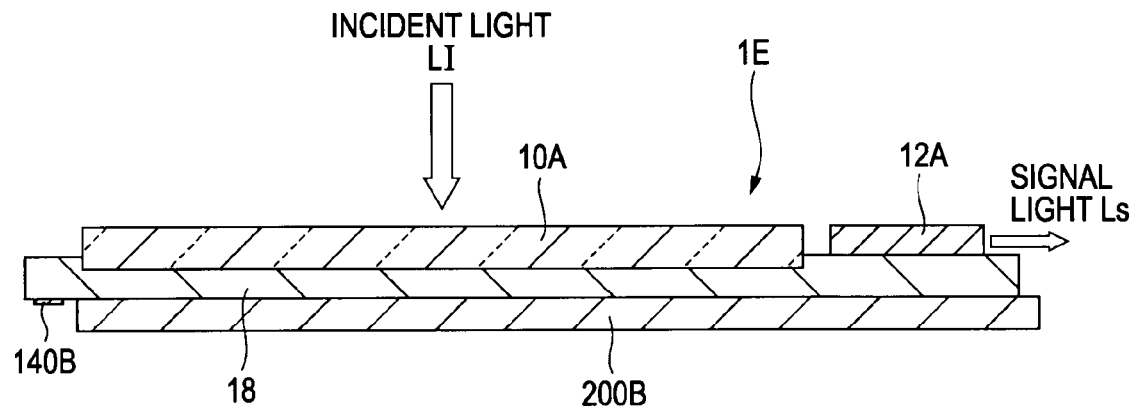
FIG. 8 is a schematic cross-sectional view illustrating an example of a solid-state image pickup device according to a second embodiment of the present invention.
Figure 9:
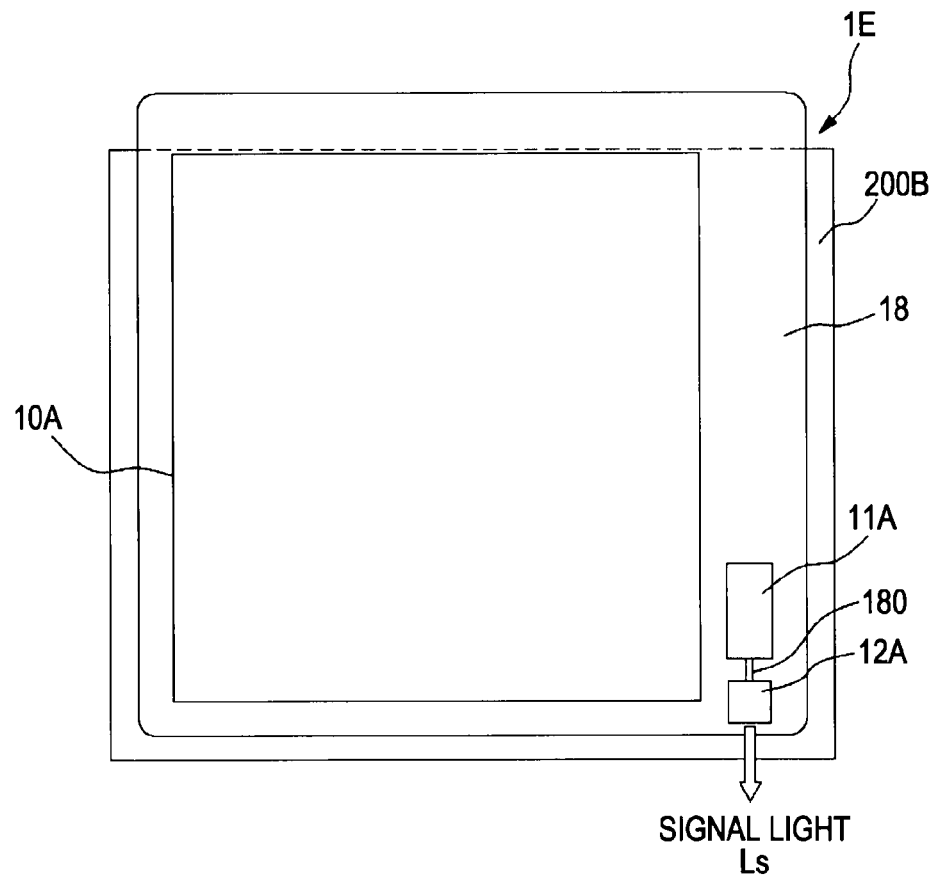
FIG. 9 is a schematic plan view illustrating a front side of a substrate included in the solid-state image pickup device of FIG. 8.
Figure 10:
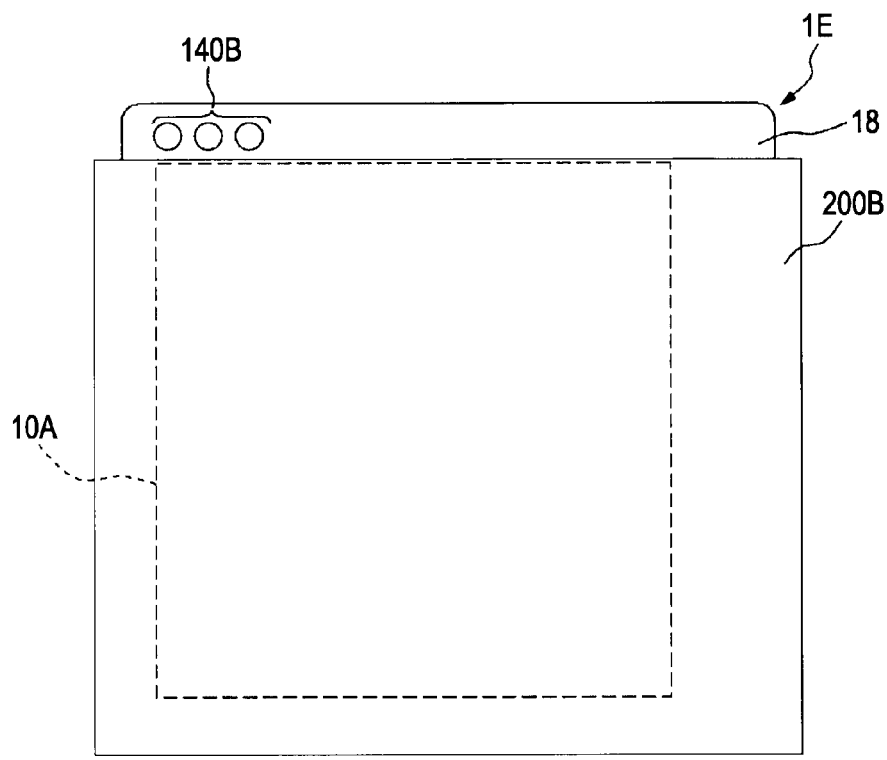
FIG. 10 is a schematic plan view illustrating a back side of the substrate of FIG. 9.

FIG. 8 is a schematic cross-sectional view illustrating an example of a solid-state image pickup device according to a second embodiment of the present invention. FIG. 9 is a schematic plan view illustrating a front side of a substrate included in the solid-state image pickup device of FIG. 8. FIG. 10 is a schematic plan view illustrating a back side of the substrate of FIG. 9.

In a solid-state image pickup device 1E of the second embodiment, processing units, such as the pixel unit 10A and optical communication unit 12A illustrated in FIG. 3, are disposed on the front side of the substrate 18. Electrical signal transmission between the processing units is performed on the front side of the substrate 18. In the solid-state image pickup device 1E, the optical communication unit 12A is disposed on the output end of the A/D converter 11A. The A/D converter 11A and the optical communication unit 12A are connected to each other through the signal wire 180. Thus, the length of wire through which a digital signal produced by A/D conversion is transmitted as an electrical signal can be reduced.

In the solid-state image pickup device 1E, a pixel signal read out from the pixel unit 10A as an electrical signal is converted into a digital signal by the A/D converter 11A, and converted into signal light Ls by the optical communication unit 12A and output. Thus, in the solid-state image pickup device 1E, a data line through which a pixel signal converted into a digital signal is transmitted can be realized by a transmission channel based on optical communication, and thus high-speed signal transmission can be achieved.

In the solid-state image pickup device 1E, an electrode pad 140B connected to the control I/O unit 14A is formed on the back side of the substrate 18. Since a pixel signal is transmitted by optical communication, it is not necessary for the solid-state image pickup device 1E to be provided with an electrode pad for externally transmitting a pixel signal as an electrical signal. Therefore, the electrode pad 140B includes at least three lines, a power supply line, a GND line, and a control line.

The electrode pad 140B is connected to the processing units on the front side of the substrate 18 by a through electrode (not shown) formed in the substrate 18. For example, the forming position of the electrode pad 140B on the back side of the substrate 18 is along one side of the substrate 18. The electrode pad 140B is formed in an area other than areas directly below the optical communication unit 12A and directly below the pixel unit 10A. Thus, on the back side of the substrate 18, no signal wire is provided in the areas directly below the optical communication unit 12A and directly below the pixel unit 10A.

The solid-state image pickup device 1E includes a cooling unit 200B on the back side of the substrate 18. The cooling unit 200B is made of higher thermal conductivity material than the substrate 18 etc. The cooling unit 200B externally dissipates heat generated in the optical communication unit 12A etc. and transferred to the substrate 18, so as to cool the optical communication unit 12A etc. The cooling unit 200B may be capable of forcibly cooling the optical communication unit 12A etc. with a fan or the like.

In the solid-state image pickup device 1E, the processing units are disposed on the front side of the substrate 18, and signal transmission is performed on the front side of the substrate 18. This means that the solid-state image pickup device 1E is configured such that no processing units and no signal wires, other than the electrode pad 140B, are provided on the back side of the substrate 18. The cooling unit 200B on the back side of the substrate 18 is configured to cover the entire back side of the forming areas of the optical communication unit 12A and pixel unit 10A, but not to cover the forming position of the electrode pad 140B.

In the solid-state image pickup device 1E, the cooling unit 200B is disposed on the entire back side of the substrate 18 except the forming position of the electrode pad 140B. This means that the cooling unit 200B is disposed directly below the optical communication unit 12A and on the entire back side of the forming area of the optical communication unit 12A. Moreover, since the cooling unit 200B is in contact with the entire back side of the substrate 18 except the forming position of the electrode pad 140B, the cooling unit 200B and the substrate 18 are in contact with each other on the entire back side of the forming area of the optical communication unit 12A, that is, at a position directly below the optical communication unit 12A.

Heat generated in the optical communication unit 12A is transferred from the optical communication unit 12A to the substrate 18. Since the substrate 18 and the cooling unit 200B are in contact with each other directly below the optical communication unit 12A, the heat transferred from the optical communication unit 12A to the substrate 18 is further transferred to the cooling unit 200B directly below the optical communication unit 12A.

Thus, heat generated in the optical communication unit 12A can be efficiently transferred to the cooling unit 200B on the back side of the substrate 18, and the efficiency of cooling the optical communication unit 12A can be increased. It is thus possible to prevent heat generated in the optical communication unit 12A from reaching the pixel unit 10A through the substrate 18.

At the same time, the cooling unit 200B is disposed directly below the pixel unit 10A, so that the back side of the substrate 18 is in contact with the cooling unit 200B directly below the entire forming area of the pixel unit 10A. Thus, heat generated in the pixel unit 10A is transferred from the entire forming area of the pixel unit 10A through the substrate 18 to the cooling unit 200B. Therefore, it is possible to uniformly cool the pixel unit 10A or dissipate heat in the pixel unit 10A, and thus to provide uniform pixel characteristics.

Modifications of Solid-State Image Pickup Device of Second Embodiment

Figure 11:
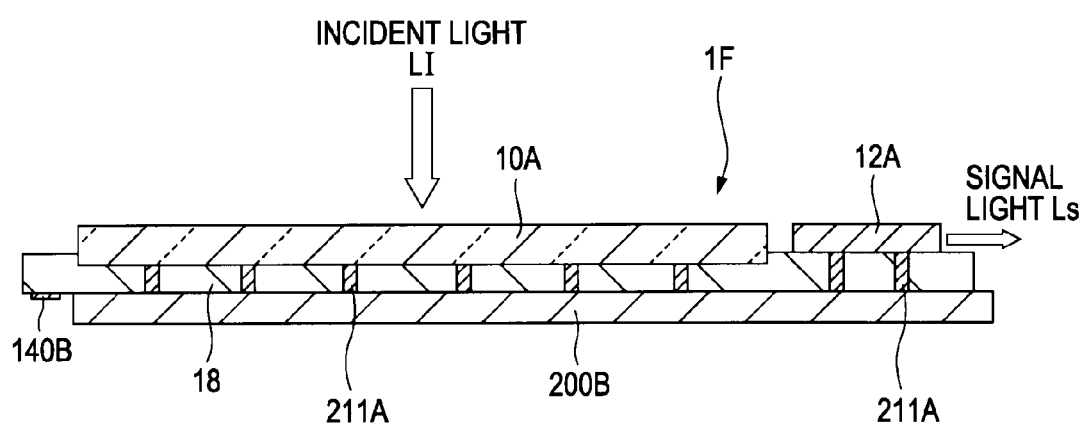
FIG. 11 is a schematic cross-sectional view illustrating a first modification of the solid-state image pickup device according to the second embodiment.

FIG. 11 is a schematic cross-sectional view illustrating a first modification of the solid-state image pickup device according to the second embodiment. A solid-state image pickup device 1F according to the first modification of the second embodiment includes the heat conducting parts 211A that connect the optical communication unit 12A and pixel unit 10A formed on the front side of the substrate 18 to the cooling unit 200B formed on the back side of the substrate 18. The substrate 18 is provided with through holes extending from the bottom of the optical communication unit 12A and pixel unit 10A to the cooling unit 200B. The heat conducting parts 211A are formed by metallizing the through holes with high thermal conductivity material.

In the solid-state image pickup device 1F, since the optical communication unit 12A, the pixel unit 10A, and the cooling unit 200B are in contact with the heat conducting parts 211A, the optical communication unit 12A and the pixel unit 10A are thermally connected to the cooling unit 200B.

One or a plurality of the heat conducting parts 211A are formed under the optical communication unit 12A and connected to the cooling unit 200B. At least one of the one or plurality of heat conducting parts 211A under the optical communication unit 12A is located directly below the heat source of the optical communication unit 12A. In the case of the pixel unit 10A, a plurality of the heat conducting parts 211A are arranged, for example, uniformly over the entire forming area of the pixel unit 10A and connected to the cooling unit 200B.

Thus, heat generated in the optical communication unit 12A can be efficiently transferred through the heat conducting parts 211A to the cooling unit 200B on the back side of the substrate 18, and the efficiency of cooling the optical communication unit 12A can be increased. It is thus possible to prevent heat generated in the optical communication unit 12A from reaching the pixel unit 10A through the substrate 18. At the same time, heat generated in the pixel unit 10A can be efficiently transferred to the cooling unit 200B on the back side of the substrate 18, and the efficiency of cooling the pixel unit 10A can be uniformly increased.

Figure 12:
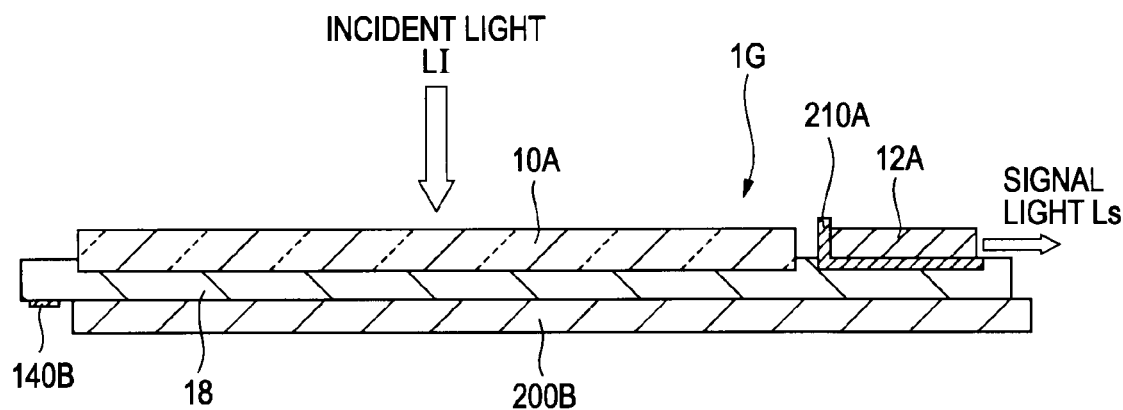
FIG. 12 is a schematic cross-sectional view illustrating a second modification of the solid-state image pickup device according to the second embodiment.
Figure 13:
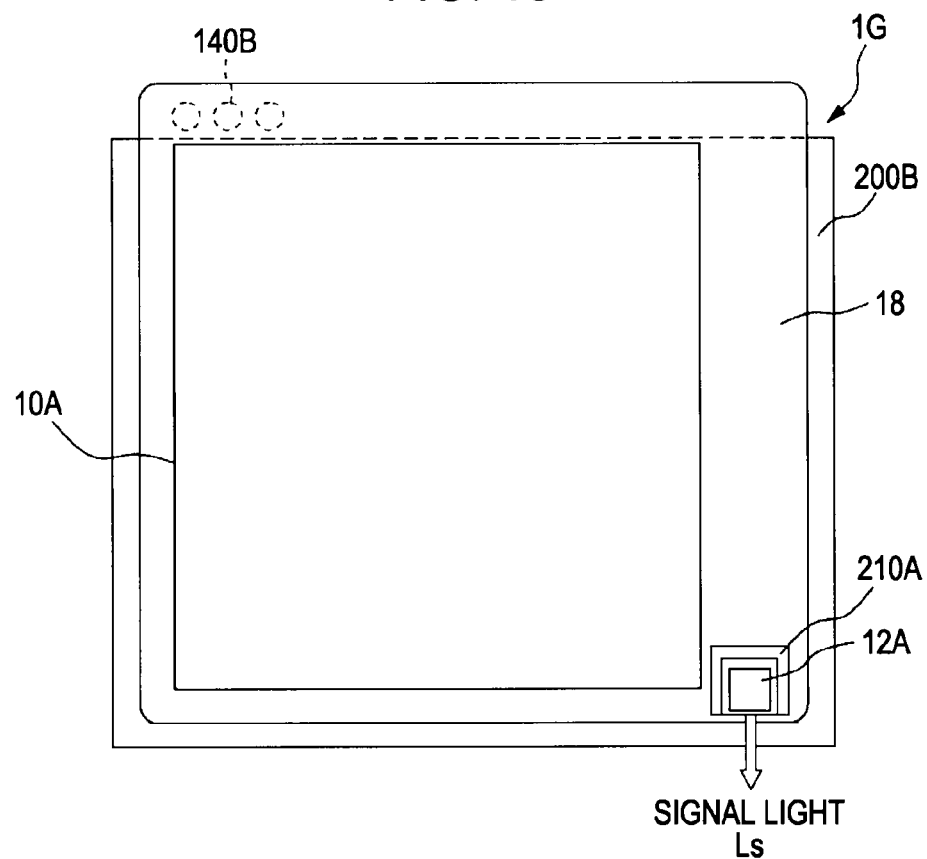
FIG. 13 is a schematic plan view of the solid-state image pickup device illustrated in FIG. 12.

FIG. 12 is a schematic cross-sectional view illustrating a second modification of the solid-state image pickup device according to the second embodiment. FIG. 13 is a schematic plan view of the solid-state image pickup device illustrated in FIG. 12. In a solid-state image pickup device 1G according to the second modification of the second embodiment, the cooling unit 210A is disposed around the optical communication unit 12A on the front side of the substrate 18.

The cooling unit 210A is made of higher thermal conductivity material than the substrate 18 etc. The cooling unit 210A externally dissipates heat generated in the optical communication unit 12A etc. to allow the optical communication unit 12A etc. to be cooled. As described above, the cooling unit 210A is configured to surround the optical communication unit 12A, except a light-emitting surface of the optical communication unit 12A, in a manner depending on the form of the optical communication unit 12A. At the same time, the cooling unit 210A is configured to be formed on an inner surface of the optical communication unit 12A, the inner surface facing toward the inside of the substrate 18 opposite the pixel unit 10A.

Heat generated in the optical communication unit 12A is transferred from the optical communication unit 12A to the cooling unit 210A, and partially dissipated from the cooling unit 210A to the outside of the substrate 18. The remaining part of the heat generated in the optical communication unit 12A is transferred to the substrate 18. Since the substrate 18 is in contact with the cooling unit 200B directly below the optical communication unit 12A, the heat transferred from the optical communication unit 12A to the substrate 18 is further transferred to the cooling unit 200B directly below the optical communication unit 12A.

Thus, heat generated in the optical communication unit 12A can be dissipated by the cooling unit 210A on the front side of the substrate 18 and efficiently transferred to the cooling unit 200B on the back side of the substrate 18, and the efficiency of cooling the optical communication unit 12A can be increased. It is thus possible to prevent heat generated in the optical communication unit 12A from reaching the pixel unit 10A through the substrate 18.

Figure 14:
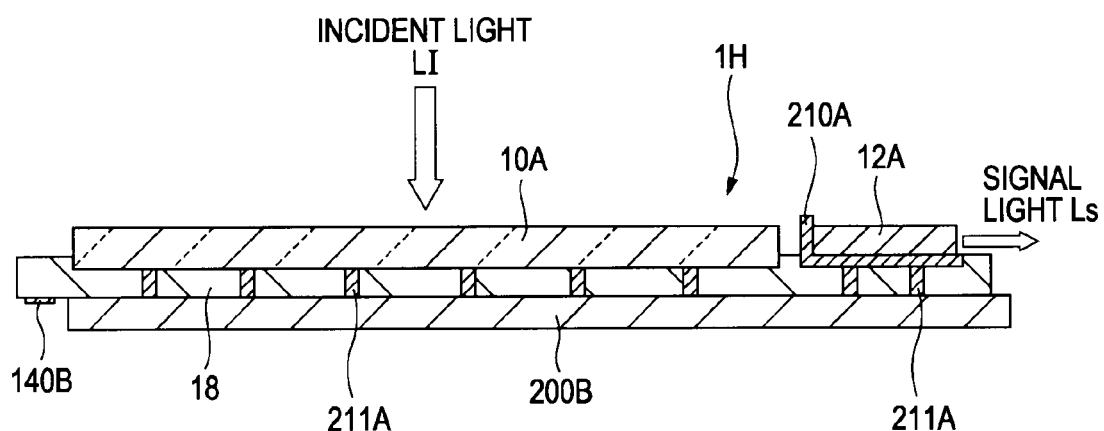
FIG. 14 is a schematic cross-sectional view illustrating a third modification of the solid-state image pickup device according to the second embodiment.

FIG. 14 is a schematic cross-sectional view illustrating a third modification of the solid-state image pickup device according to the second embodiment. In a solid-state image pickup device 1H according to the third modification of the second embodiment, the cooling unit 210A described above is disposed around the optical communication unit 12A on the front side of the substrate 18. Additionally, the solid-state image pickup device 1H includes the heat conducting parts 211A that connect the cooling unit 210A formed on the front side of the substrate 18 to the cooling unit 200B formed on the back side of the substrate 18. The heat conducting parts 211A also connect the pixel unit 10A to the cooling unit 200B.

In the solid-state image pickup device 1H, the cooling unit 210A formed on the lower surface of the optical communication unit 12A is connected through the heat conducting parts 211A to the cooling unit 200B on the back side of the substrate 18. Thus, heat generated in the optical communication unit 12A can be efficiently transferred from the cooling unit 210A through the heat conducting parts 211A to the cooling unit 200B on the back side of the substrate 18, and the efficiency of cooling the optical communication unit 12A can be increased. It is thus possible to prevent heat generated in the optical communication unit 12A from reaching the pixel unit 10A through the substrate 18.

Modification of Solid-State Image Pickup Device of Each Embodiment

Figure 15:
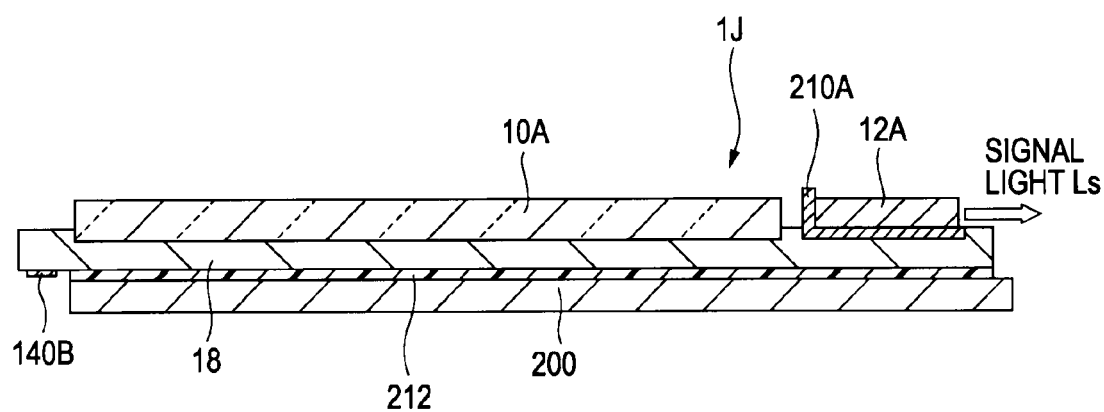
FIG. 15 is a schematic cross-sectional view illustrating a modification of a solid-state image pickup device according to each embodiment of the present invention.

FIG. 15 is a schematic cross-sectional view illustrating a modification of a solid-state image pickup device according to each embodiment of the present invention. A solid-state image pickup device 1J according to a modification of each embodiment of the present invention includes a heat conducting member 212 between the substrate 18 and a cooling unit 200 (A or B).

Like the cooling unit 200, the heat conducting member 212 is made of high thermal conductivity material, with which a gap between the substrate 18 and the cooling unit 200 is filled. A gap between the cooling unit 210A formed on the front side of the substrate 18 and a non-light-emitting surface of the optical communication unit 12A may also be filled with the heat conducting member 212. The heat conducting member 212 is made of material having high thermal conductivity, high thermal resistance, and high light-blocking properties that can block light leaking from the optical communication unit 12A. For example, the heat conducting member 212 is made of high thermal conductivity epoxy resin. Thus, heat transferred from the optical communication unit 12A to the substrate 18 can be efficiently transferred to the cooling unit 200.

Exemplary Configuration of Cooling Unit of Each Embodiment

A cooling unit according to each embodiment of the present invention may a forced cooling device of any type. Examples of the forced cooling device include a wind cooling device, such as a fan; an air cooling device that blows dry air; a drive device including a thermoelectric conversion element, such as a Peltier element; and a liquid cooling device that circulates liquid, such as water. Alternatively, the cooling unit according to each embodiment of the present invention may be a device for natural cooling, or may be a heat sink or a heat pipe.

(Exemplary Configuration of Cooling Unit for Each Arrangement of Optical Communication Unit)

Figure 16:
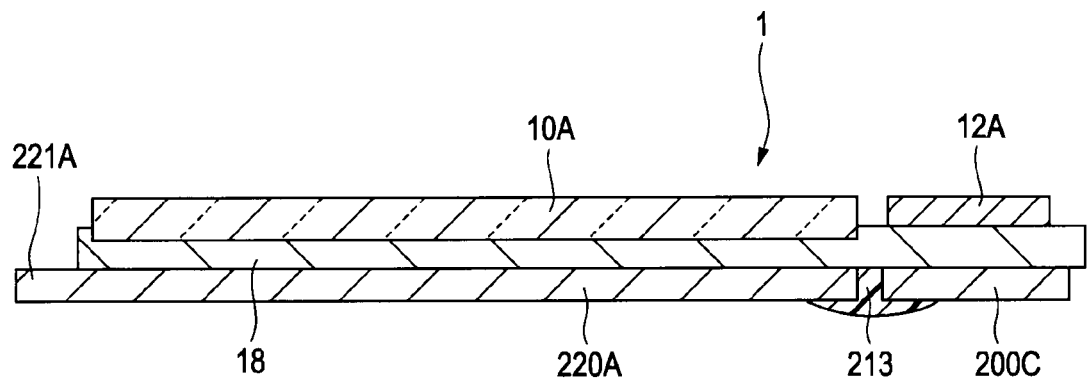
FIG. 16 is a schematic cross-sectional view of a solid-state image pickup device, the cross-sectional view illustrating an exemplary configuration of a cooling unit for an optical communication unit arranged in a centralized manner.
Figure 17:
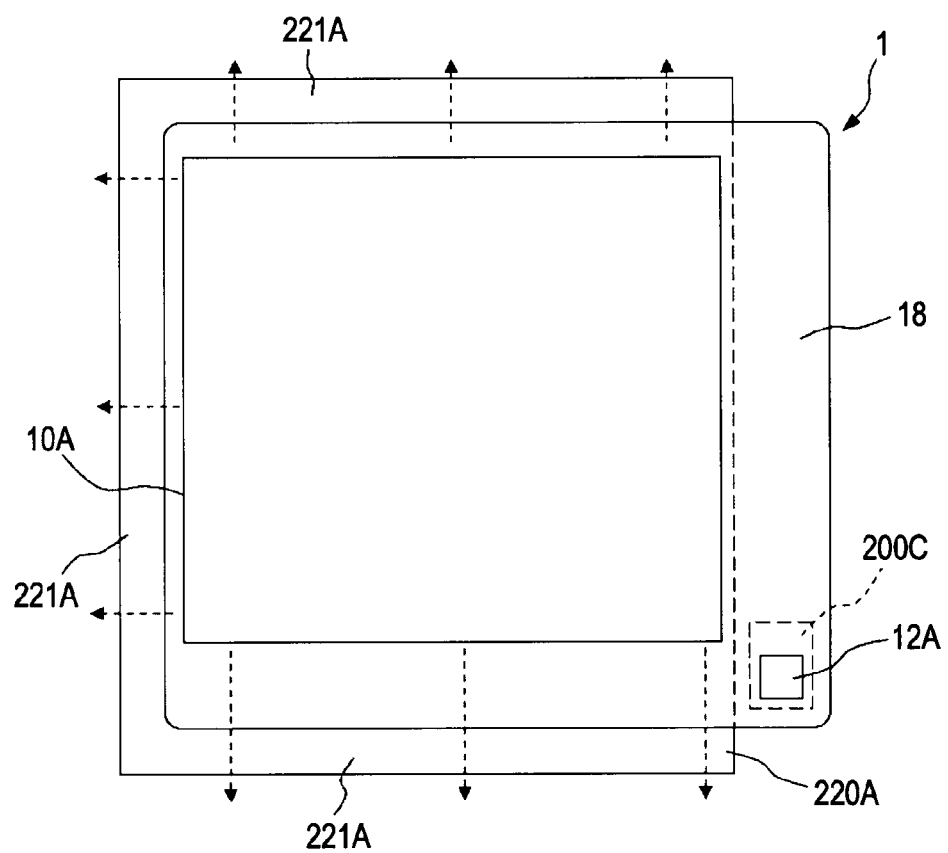
FIG. 17 is a schematic plan view illustrating a front side of a substrate included in the solid-state image pickup device of FIG. 16.
Figure 18:
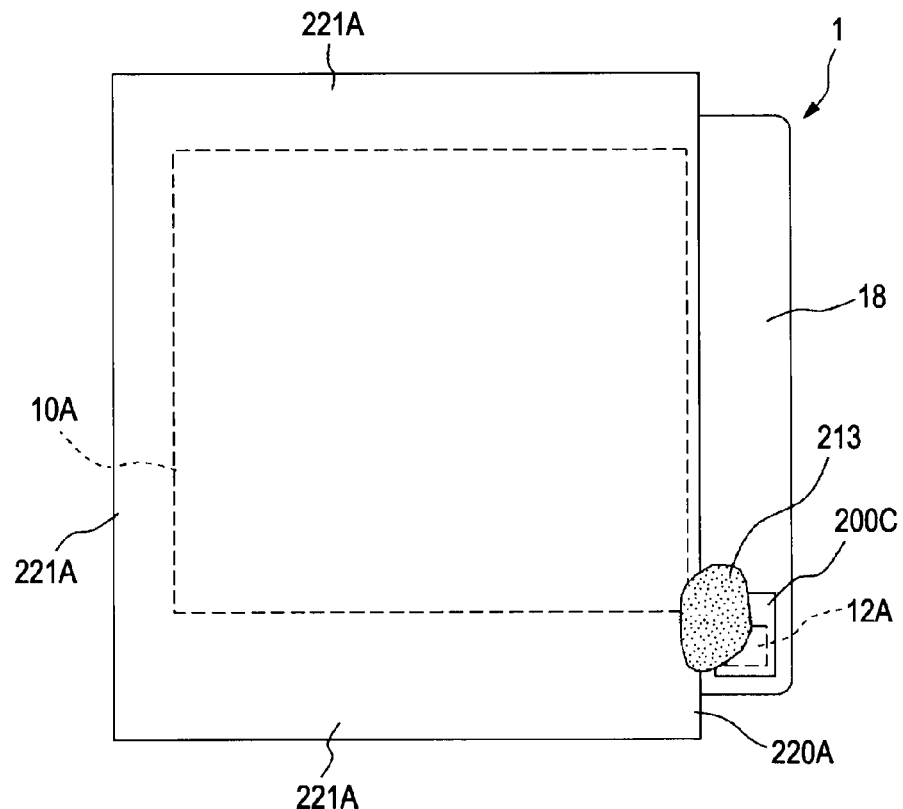
FIG. 18 is a schematic plan view illustrating a back side of the substrate of FIG. 17.

(1) Exemplary Configuration of Cooling Unit for Optical Communication Unit Arranged in Centralized Manner FIG. 16 is a schematic cross-sectional view of a solid-state image pickup device, the cross-sectional view illustrating an exemplary configuration of a cooling unit for an optical communication unit arranged in a centralized manner. FIG. 17 is a schematic plan view illustrating a front side of a substrate included in the solid-state image pickup device of FIG. 16. FIG. 18 is a schematic plan view illustrating a back side of the substrate of FIG. 17.

In a solid-state image pickup device 1 of FIG. 17, one optical communication unit 12A is arranged in a centralized manner at one corner of the substrate 18. The solid-state image pickup device 1 includes a cooling unit 200C on the back side of the substrate 18 and directly below the optical communication unit 12A. The cooling unit 200C is made of higher thermal conductivity material than the substrate 18 etc. The cooling unit 200C externally dissipates heat generated in the optical communication unit 12A etc. and transferred to the substrate 18, and thereby allows the optical communication unit 12A etc. to be naturally cooled. The cooling unit 200C may be capable of forcibly cooling the optical communication unit 12A etc. with a fan or the like.

The solid-state image pickup device 1 includes a heat dissipating plate 220A on the entire back side of the substrate 18 except the forming position of the cooling unit 200C. The heat dissipating plate 220A is made of higher thermal conductivity material than the substrate 18 etc. As described above, no processing units and no signal wires are provided on the back side of the substrate 18. The heat dissipating plate 220A on the back side of the substrate 18 is configured to cover the entire forming area of the pixel unit 10A. The heat dissipating plate 220A partially extends beyond the contour of the solid-state image pickup device 1 to form an external heat-dissipating part 221A outside the substrate 18. In this example, three sides of the heat dissipating plate 220A extend outward to form the external heat-dissipating part 221A.

The solid-state image pickup device 1 includes a heat conducting member 213 between the cooling unit 200C and the heat dissipating plate 220A. Like the cooling unit 200C and the heat dissipating plate 220A, the heat conducting member 213 is made of high thermal conductivity material, with which a gap between the cooling unit 200C and the heat dissipating plate 220A is filled. The heat conducting member 213 is made of material having high thermal conductivity and high thermal resistance. For example, the heat conducting member 213 is made of high thermal conductivity epoxy resin. Thus, heat transferred from the optical communication unit 12A to the cooling unit 200C can be efficiently transferred to the heat dissipating plate 220A.

When the cooling unit 200C and the heat dissipating plate 220A are included in the solid-state image pickup device 1 in which the optical communication unit 12A is arranged in a centralized manner, heat generated in the optical communication unit 12A is transferred to the cooling unit 200C. The heat transferred to the cooling unit 200C is further transferred to the heat dissipating plate 220A and dissipated through the external heat-dissipating part 221A to the outside, as indicated by arrows in FIG. 17. At the same time, heat generated in the pixel unit 10A etc. is transferred to the heat dissipating plate 220A and also dissipated through the external heat-dissipating part 221A to the outside, as indicated by arrows in FIG. 17.

Thus, heat generated in the optical communication unit 12A can be dissipated, on the back side of the substrate 18, to the outside of the solid-state image pickup device 1. Heat generated in the pixel unit 10A etc. on the front side of the substrate 18 can also be transferred to the back side of the substrate 18 and dissipated to the outside of the solid-state image pickup device 1. Therefore, it is possible to significantly reduce the effect of heat generated in the optical communication unit 12A on the pixel unit 10A. Additionally, since the gap between the cooling unit 200C and the heat dissipating plate 220A is filed with the heat conducting member 213, a higher efficiency of heat dissipation can be achieved, as compared to the configuration in which heat is transferred by air.

Figure 19:
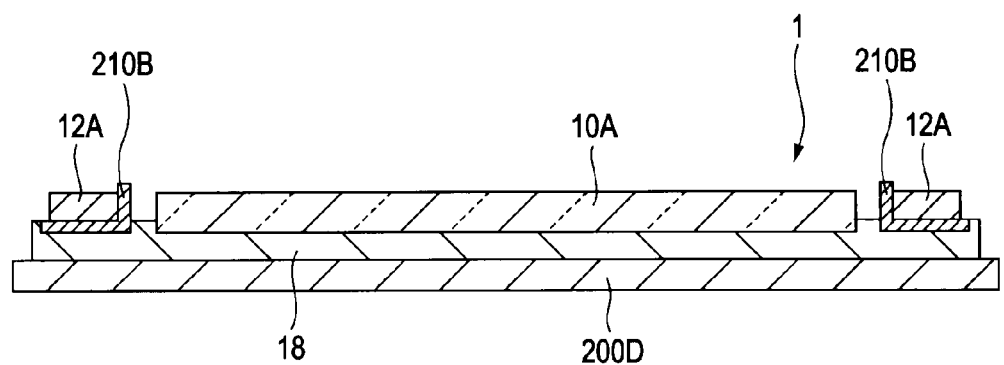
FIG. 19 is a schematic cross-sectional view of a solid-state image pickup device, the cross-sectional view illustrating an exemplary configuration of cooling units for optical communication units arranged in a distributed manner.
Figure 20:
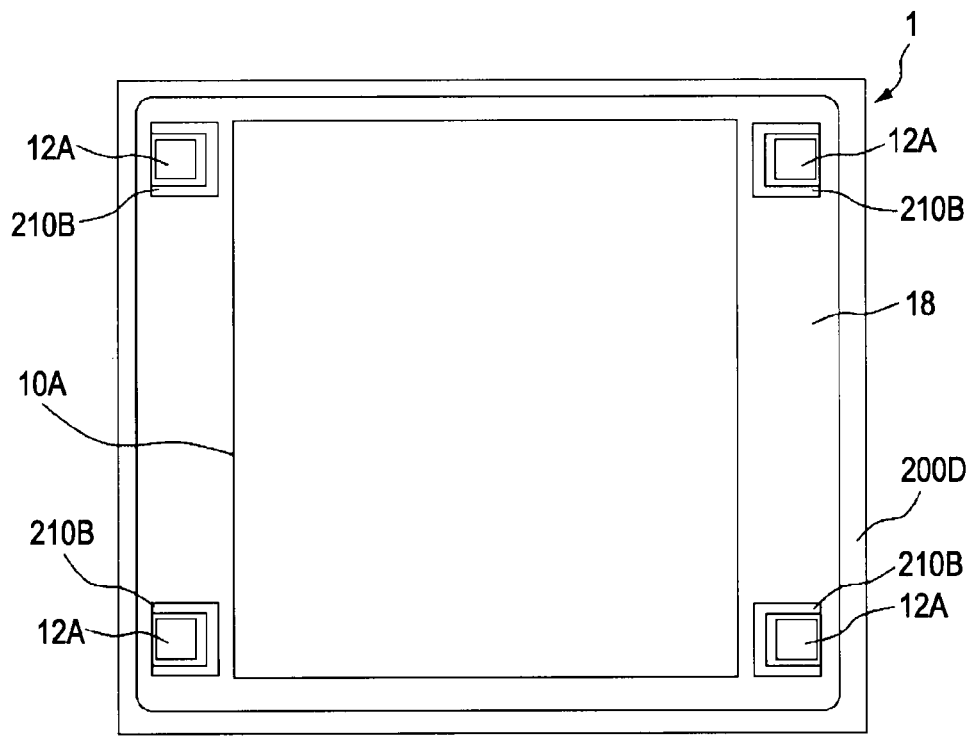
FIG. 20 is a schematic plan view illustrating a front side of a substrate included in the solid-state image pickup device of FIG. 19.

(2) Exemplary Configuration of Cooling Units for Optical Communication Units Arranged in Distributed Manner FIG. 19 is a schematic cross-sectional view of a solid-state image pickup device, the cross-sectional view illustrating an exemplary configuration of cooling units for optical communication units arranged in a distributed manner. FIG. 20 is a schematic plan view illustrating a front side of a substrate included in the solid-state image pickup device of FIG. 19.

In a solid-state image pickup device 1 of FIG. 20, four optical communication units 12A are arranged at respective four corners of the substrate 18 in a distributed manner. The solid-state image pickup device 1 includes a cooling unit 200D on the entire back side of the substrate 18. The cooling unit 200D is made of higher thermal conductivity material than the substrate 18 etc. The cooling unit 200D externally dissipates heat generated in the optical communication units 12A etc. and transferred to the substrate 18, and thereby allows the optical communication units 12A etc. to be naturally cooled. The cooling unit 200D may be capable of forcibly cooling the optical communication units 12A etc. with a fan or the like.

As described above, the solid-state image pickup device 1 is configured such that no processing units and no signal wires are provided on the back side of the substrate 18. The cooling unit 200D on the entire back side of the substrate 18, for example, may have the same shape as that of the substrate 18, or may extend beyond each side of the substrate 18 depending on how the solid-state image pickup device 1 is mounted.

In the solid-state image pickup device 1, the cooling unit 200D is disposed on the entire back side of the substrate 18. This means that the cooling unit 200D is disposed directly below the optical communication units 12A arranged in a distributed manner and on the entire back side of the forming areas of the optical communication units 12A. Moreover, since the cooling unit 200D is in contact with the entire back side of the substrate 18, the cooling unit 200D and the substrate 18 are in contact with each other on the entire back side of the forming areas of the optical communication units 12A, that is, at a position directly below each of the optical communication units 12A.

The solid-state image pickup device 1 includes cooling units 210B around the respective optical communication units 12A. The cooling units 210B are made of higher thermal conductivity material than the substrate 18. The cooling units 210B externally dissipate heat generated in the optical communication units 12A to allow the optical communication units 12A to be naturally cooled. The cooling units 210B may be capable of forcibly cooling the optical communication units 12A etc. with a fan or the like. Each of the cooling units 210B is configured to be formed on an inner surface of the corresponding optical communication unit 12A, the inner surface facing toward the inside of the substrate 18 opposite the pixel unit 10A. This is to prevent heat from being transferred to the inside of the substrate 18 on which the pixel unit 10A etc. are formed.

As described above, the cooling unit 200D and the cooling units 210B are provided in the solid-state image pickup device 1 in which the optical communication units 12A are arranged in a distributed manner. Heat generated in each of the optical communication units 12A is transferred to the substrate 18. Since the substrate 18 and the cooling unit 200D are in contact with each other directly below each of the optical communication units 12A, the heat transferred from each of the optical communication units 12A to the substrate 18 is further transferred from the substrate 18 to the cooling unit 200D directly below each of the optical communication units 12A.

Thus, heat generated in the optical communication units 12A arranged in a distributed manner can be efficiently transferred to the cooling unit 200D on the back side of the substrate 18, and the efficiency of cooling the optical communication units 12A can be increased. It is thus possible to prevent heat generated in the optical communication units 12A from reaching the pixel unit 10A through the substrate 18.

At the same time, the cooling unit 200D is disposed directly below the pixel unit 10A, so that the back side of the substrate 18 is in contact with the cooling unit 200D directly below the entire forming area of the pixel unit 10A. Thus, heat generated in the pixel unit 10A is transferred from the entire forming area of the pixel unit 10A through the substrate 18 to the cooling unit 200D. Therefore, it is possible to uniformly cool the pixel unit 10A or dissipate heat in the pixel unit 10A, and thus to provide uniform pixel characteristics.

Additionally, since the cooling units 210B are formed around the respective optical communication units 12A on the front side of the substrate 18, heat generated in the optical communication units 12A are partially transferred to the cooling units 210B. Thus, heat generated in each of the optical communication units 12A arranged in a distributed manner is transferred in a direction opposite the pixel unit 10A and does not reach the pixel unit 10A. Therefore, it is possible to significantly reduce the effect of heat generated in the optical communication units 12A on the pixel unit 10A.

Figure 21:
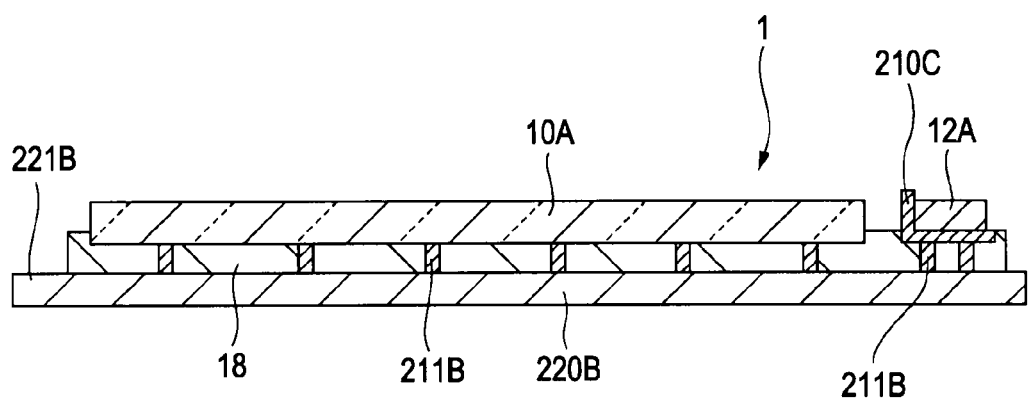
FIG. 21 is a schematic cross-sectional view of a solid-state image pickup device, the cross-sectional view illustrating an exemplary configuration of cooling units for groups of optical communication units, the groups being arranged in a distributed manner.
Figure 22:
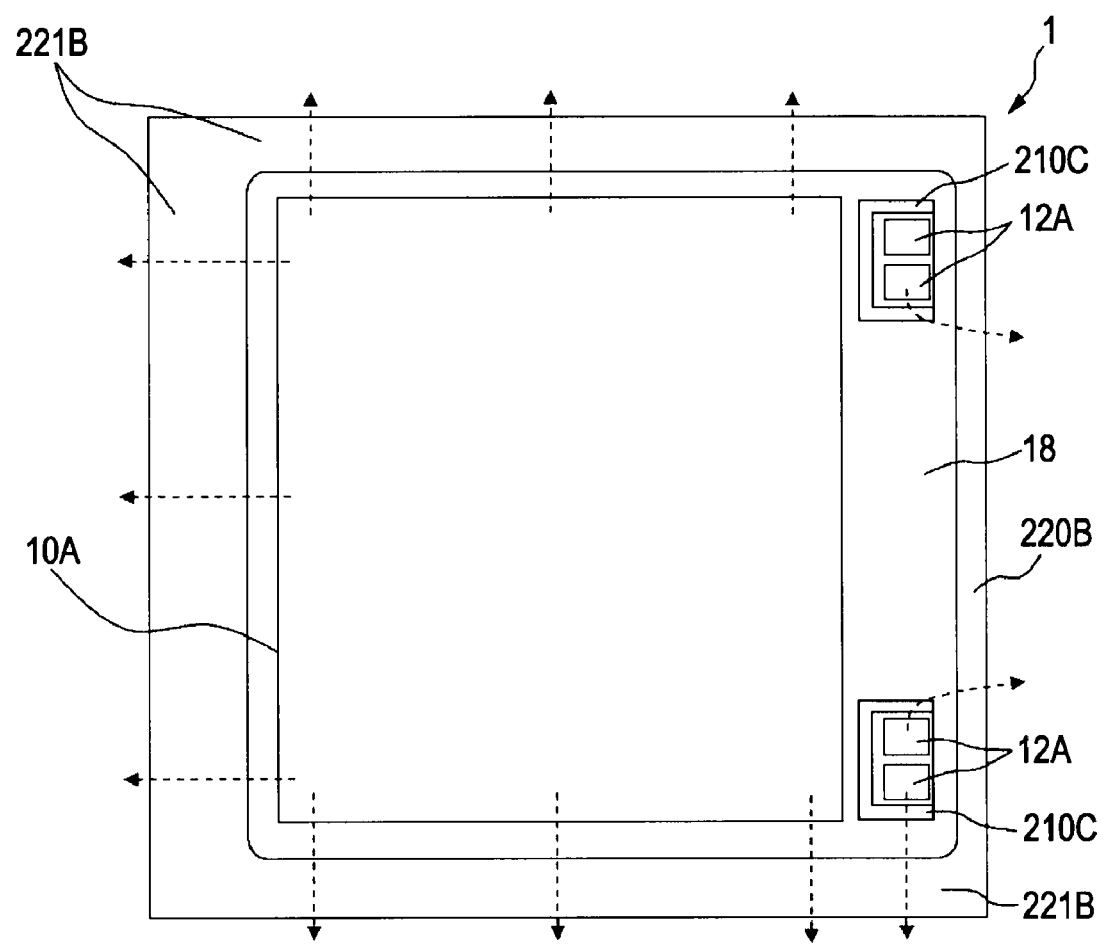
FIG. 22 is a schematic plan view illustrating a front side of a substrate included in the solid-state image pickup device of FIG. 21.

(3) Exemplary Configuration of Cooling Units for Optical Communication Unit Groups Arranged in Distributed Manner FIG. 21 is a schematic cross-sectional view of a solid-state image pickup device, the cross-sectional view illustrating an exemplary configuration of cooling units for groups of optical communication units, the groups being arranged in a distributed manner. FIG. 22 is a schematic plan view illustrating a front side of a substrate included in the solid-state image pickup device of FIG. 21.

In the solid-state image pickup device 1 of FIG. 22, two groups of optical communication units 12A close to each other are arranged at respective two corners of the substrate 18 in a distributed manner. The solid-state image pickup device 1 includes cooling units 210C around the respective two groups of optical communication units 12A. The cooling units 210C are made of higher thermal conductivity material than the substrate 18. The cooling units 210C externally dissipate heat generated in the optical communication units 12A to allow the optical communication units 12A to be naturally cooled. The cooling units 210C may be capable of forcibly cooling the optical communication units 12A etc. with a fan or the like. Each of the cooling units 210B is configured to be formed on inner surfaces of the corresponding optical communication units 12A, the inner surfaces facing toward the inside of the substrate 18 opposite the pixel unit 10A. This is to prevent heat from being transferred to the inside of the substrate 18 on which the pixel unit 10A etc. are formed.

The solid-state image pickup device 1 includes, as a cooling unit, a heat dissipating plate 220B on the entire back side of the substrate 18. The heat dissipating plate 220B is made of higher thermal conductivity material than the substrate 18 etc. The heat dissipating plate 220B externally dissipates heat generated in the optical communication units 12A etc. and transferred to the substrate 18, and thereby allows the optical communication units 12A etc. to be naturally cooled.

As described above, the solid-state image pickup device 1 is configured such that no processing units and no signal wires are provided on the back side of the substrate 18. The heat dissipating plate 220B is disposed on the entire back side of the substrate 18. The heat dissipating plate 220B partially extends beyond the contour of the solid-state image pickup device 1 to form an external heat-dissipating part 221B outside the substrate 18. In this example, four sides of the heat dissipating plate 220B extend outward to form the external heat-dissipating part 221B.

In the solid-state image pickup device 1, the heat dissipating plate 220B is disposed on the entire back side of the substrate 18. This means that the heat dissipating plate 220B is disposed directly below each of the two groups of optical communication units 12A, the two groups being arranged in a distributed manner, and on the entire back side of the forming areas of the optical communication units 12A. Moreover, since the heat dissipating plate 220B is in contact with the entire back side of the substrate 18, the heat dissipating plate 220B and the substrate 18 are in contact with each other on the entire back side of the forming areas of the optical communication units 12A, that is, at a position directly below each of the two groups of optical communication units 12A.

The solid-state image pickup device 1 includes heat conducting parts 211B that connect the optical communication units 12A and pixel unit 10A formed on the front side of the substrate 18 to the heat dissipating plate 220B formed on the back side of the substrate 18. The substrate 18 is provided with through holes extending from the bottom of the optical communication units 12A and pixel unit 10A to the heat dissipating plate 220B. The heat conducting parts 211B are formed by metallizing the through holes with high thermal conductivity material.

In the solid-state image pickup device 1, since the optical communication units 12A, the pixel unit 10A, and the heat dissipating plate 220B are in contact with the heat conducting parts 211B, the optical communication units 12A and the pixel unit 10A are thermally connected to the heat dissipating plate 220B.

One or a plurality of the heat conducting parts 211B are formed under each of the optical communication units 12A and connected to the heat dissipating plate 220B. At least one of the one or plurality of heat conducting parts 211B under each of the optical communication units 12A is located directly below the heat source of the optical communication unit 12A. In the case of the pixel unit 10A, a plurality of the heat conducting parts 211B are arranged, for example, uniformly over the entire forming area of the pixel unit 10A and connected to the heat dissipating plate 220B. When the cooling units 210C are formed on the lower surfaces of the optical communication units 12A, the cooling units 210C are connected to the heat conducting parts 211B.

As described above, in the solid-state image pickup device 1 in which the groups of optical communication units 12A close to each other are arranged in a distributed manner, there are the cooling units 210C, the heat dissipating plate 220B, and the heat conducting parts 211B. Thus, heat generated in each of the optical communication units 12A is transferred to the corresponding cooling unit 210C. Since heat generated in each of the optical communication units 12A is transferred in a direction opposite the pixel unit 10A and does not reach the pixel unit 10A, it is possible to significantly reduce the effect of heat generated in the optical communication units 12A on the pixel unit 10A.

Thus, heat generated in the optical communication units 12A can be efficiently transferred through the heat conducting parts 211B to the heat dissipating plate 220B on the back side of the substrate 18, and the efficiency of cooling the optical communication units 12A can be increased. It is thus possible to prevent heat generated in the optical communication units 12A from reaching the pixel unit 10A through the substrate 18. At the same time, heat generated in the pixel unit 10A can be efficiently transferred to the heat dissipating plate 220B on the back side of the substrate 18, and the efficiency of cooling the pixel unit 10A can be uniformly increased.

(Overview of Signal Processing System Including Solid-State Image Pickup Device)

FIG. 23 is a functional block diagram illustrating an overview of a signal processing system including a solid-state image pickup device. First, an overview of an optical apparatus including a solid-state image pickup device will be described. An optical apparatus 2A includes the solid-state image pickup device 1 (one of the solid-state image pickup devices 1A to 1J) described above, a lens assembly 20, and a housing 21 on which the solid-state image pickup device 1 and the lens assembly 20 are mounted. For example, the optical apparatus 2A constitutes a lens unit of a camera system. The lens assembly 20 is an example of an optical device and includes one or more lenses.

The optical apparatus 2A is configured such that the pixel unit 10A of the solid-state image pickup device 1 is aligned with the focal point of the lens assembly 20. An image of light incident from the lens assembly 20 is formed in the pixel unit 10A of the solid-state image pickup device 1.

To align the focal point of the lens assembly 20 with the pixel unit 10A of the solid-state image pickup device 1 regardless of the distance to an object whose image is to be picked up, the optical apparatus 2A has, for example, a focus positioning mechanism that moves the lens assembly 20 with respect to the solid-state image pickup device 1 in the direction of optical axis.

Next, an overview of a signal processing apparatus to which an optical apparatus is connected will be described. A signal processing apparatus 3A includes an optical communication unit 30A that converts an optical signal into an electrical signal, and a control I/O unit 31A that inputs and outputs a control signal etc. For example, the signal processing apparatus 3A constitutes a camera body of a camera system. When the optical apparatus 2A is connected to the signal processing apparatus 3A, the optical communication unit 30A is optically coupled to the optical communication unit 12A of the solid-state image pickup device 1. At the same time, the control I/O unit 31A is connected to the control I/O unit 14A of the solid-state image pickup device 1.

The signal processing apparatus 3A includes an operation unit 32A that accepts a user operation, and a readout control unit 33A that gives an instruction to read out pixel data to the solid-state image pickup device 1 of the optical apparatus 2A.

From the control I/O unit 31A of the signal processing apparatus 3A, an instruction to read out pixel data is given to the solid-state image pickup device 1 of the optical apparatus 2A. Through optical communication between the optical communication unit 30A of the signal processing apparatus 3A and the optical communication unit 12A of the solid-state image pickup device 1, the signal processing apparatus 3A obtains pixel data from the solid-state image pickup device 1.

The optical communication unit 30A includes a light detecting element, such as a photodiode (PD), that serves as a light detecting unit. Signal light Ls output from the optical communication unit 12A of the solid-state image pickup device 1 is input to the optical communication unit 30A. The optical communication unit 30A converts pixel data input as an optical signal into an electrical signal and outputs the electrical signal.

In a configuration in which the optical communication unit 12A of the solid-state image pickup device 1 includes an optical modulator that modulates external light, the optical communication unit 30A of the signal processing apparatus 3A includes a light emitting unit that outputs light input to the optical modulator of the solid-state image pickup device 1. The light emitting unit includes a light emitting element, such as a semiconductor laser, and outputs a series of constant beams of light L.

The signal processing apparatus 3A includes a signal processing unit 34A that performs predetermined signal processing on pixel data obtained through optical communication with the solid-state image pickup device 1 so as to generate image data. The signal processing apparatus 3A further includes a data holding unit 35A that holds pixel data obtained from the solid-state image pickup device 1, and a display unit 36A that displays an image corresponding to image data generated by the signal processing unit 34A.

The signal processing apparatus 3A further includes a power source 37A that supplies power to both the signal processing apparatus 3A and the optical apparatus 2A, and a power control unit 38A that controls the supply of power. In response to an operation for turning on or off the signal processing apparatus 3A, the power control unit 38A performs power supply control to perform switching, in a predetermined order, between the start and stop of power supply to the signal processing apparatus 3A, and between the start and stop of power supply to the optical apparatus 2A.

Next, an overview of a signal processing system that includes an optical apparatus and a signal processing apparatus will be described. A signal processing system 4A includes the optical apparatus 2A and signal processing apparatus 3A described above and, for example, constitutes a camera system. The camera system is configured such that the optical apparatus 2A constituting a lens unit is replaceable and removable from the signal processing apparatus 3A constituting a camera body.

In the signal processing system 4A, when the optical apparatus 2A is connected to the signal processing apparatus 3A, the optical communication unit 30A of the signal processing apparatus 3A is optically coupled to the optical communication unit 12A of the solid-state image pickup device 1 included in the optical apparatus 2A. At the same time, the control I/O unit 31A of the signal processing apparatus 3A is connected to the control I/O unit 14A of the solid-state image pickup device 1.

Thus, in the signal processing system 4A, the optical communication unit 12A of the solid-state image pickup device 1 and the optical communication unit 30A of the signal processing apparatus 3A input and output data as an optical signal between the optical apparatus 2A and the signal processing apparatus 3A.

Additionally, in the signal processing system 4A, the control I/O unit 31A of the signal processing apparatus 3A and the control I/O unit 14A of the solid-state image pickup device 1 input and output a control signal between the signal processing apparatus 3A and the optical apparatus 2A. Also, in the signal processing system 4A, the control I/O unit 31A of the signal processing apparatus 3A and the control I/O unit 14A of the solid-state image pickup device 1 allow power to be supplied from the signal processing apparatus 3A to the optical apparatus 2A.

In the signal processing system 4A, in accordance with a user operation accepted by the operation unit 32A of the signal processing apparatus 3A, the readout control unit 33A of the signal processing apparatus 3A outputs a control signal to give an instruction to read out pixel data.

In the signal processing system 4A, the control signal giving an instruction to read out pixel data is output from the control I/O unit 31A of the signal processing apparatus 3A and input to the solid-state image pickup device 1 of the optical apparatus 2A through the control I/O unit 14A of the optical apparatus 2A.

In the signal processing system 4A, when the control signal giving an instruction to read out pixel data is input to the solid-state image pickup device 1 of the optical apparatus 2A, the control unit 16A of the solid-state image pickup device 1 causes the timing generator 13A to generate a drive clock.

The drive clock generated by the timing generator 13A is supplied to the pixel unit 10A, the A/D converter 11A, and the optical communication unit 12A. In the pixel unit 10A, pixel data is read out as an electrical signal. The pixel data read out from the pixel unit 10A is input to the A/D converter 11A, converted into a digital signal, and output. The electrical signal converted into a digital signal by the A/D converter 11A is input to the optical communication unit 12A, so that the pixel data is converted into signal light Ls and output. In a configuration in which the optical communication unit 12A of the solid-state image pickup device 1 includes an optical modulator that modulates external light, the optical communication unit 12A modulates a certain amount of light input from the signal processing apparatus 3A on the basis of the electrical signal converted into a digital signal by the A/D converter 11A, and outputs signal light Ls.

In the signal processing system 4A, pixel data read out in the solid-state image pickup device 1 is output from the optical communication unit 12A and input through optical communication to the optical communication unit 30A of the signal processing apparatus 3A.

In the signal processing system 4A, after pixel data read out in the solid-state image pickup device 1 is input to the signal processing apparatus 3A through optical communication, the optical communication unit 30A converts the pixel data input as an optical signal into an electrical signal and outputs the electrical signal.

In the signal processing system 4A, the signal processing unit 34A of the signal processing apparatus 3A performs predetermined signal processing on the pixel data converted into the electrical signal by the optical communication unit 30A, and thus generates image data. An image corresponding to the generated image data is, for example, displayed on the display unit 36A.

(Exemplary Effects of Solid-state Image Pickup Device Including Cooling Unit Disposed on Back Side of Substrate)

In a solid-state image pickup device according to each embodiment of the present invention, an optical communication unit is disposed on a front side of a substrate, the front side being a side where a pixel unit is formed, while a cooling unit is disposed on a back side of the substrate. Since the pixel unit, the optical communication unit, and processing units and signal wires for reading out signals are formed on the front side of the substrate, the cooling unit that provides a desired level of cooling efficiency can be disposed on the back side of the substrate in accordance with the arrangement of the optical communication unit etc.

Thus, heat generated in the optical communication unit on the front side of the substrate can be efficiently cooled by the cooling unit disposed in a large area on the back side of the substrate. Moreover, when the cooling unit is disposed on the entire back side of the substrate, since the cooling unit is located below the forming area of the pixel unit, it is possible to uniformly cool the pixel unit and thus to provide uniform pixel characteristics.

Additionally, since the degree of freedom of arrangement of the cooling unit is improved, it is possible to adopt various cooling methods, such as a method in which optical communication units are arranged in a centralized manner and cooled together, and a method in which optical communication units are arranged in a distributed manner so that heat sources are separated and cooled.

The present application contains subject matter related to that disclosed in Japanese Priority Patent Application JP 2008-264582 filed in the Japan Patent Office on Oct. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a pixel unit configured to convert light into an electrical signal;
a substrate having a first side on which the pixel unit is formed and a second side opposite the first side;
an optical communication unit laterally disposed side by side with the pixel unit on the first side of the substrate, and configured to convert a signal read out from the pixel unit into an optical signal and output the optical signal; and
a cooling unit disposed on the second side of the substrate and configured to cool or dissipate heat generated in the optical communication unit and transferred through the substrate, the substrate being sandwiched between the optical communication unit and at least a portion of the cooling unit.

2. The solid-state image pickup device according to claim 1, wherein the substrate is further sandwiched between the cooling unit and the pixel unit, and wherein the cooling unit is configured to cool or dissipate heat generated in both the optical communication unit and the pixel unit and transferred through the substrate.

3. The solid-state image pickup device according to claim 2, further comprising heat conducting parts passing through the substrate and configured to thermally connect the optical communication unit and the pixel unit to the cooling unit.

4. The solid-state image pickup device according to claim 2, further comprising an electrode unit disposed on the first side of the substrate and to which power and a control signal for controlling readout of a signal from the pixel unit are supplied,
wherein the cooling unit is disposed on the entire second side of the substrate.

5. The solid-state image pickup device according to claim 2, further comprising:
a second cooling unit disposed on the first side of the substrate and configured to cool or dissipate heat generated in the optical communication unit.

6. The solid-state image pickup device according to claim 1, further comprising:
a heat dissipating plate disposed on the second side of the substrate and configured to naturally dissipate heat transferred through the substrate, the substrate being further sandwiched between the heat dissipating plate and the pixel unit; and
a conducting member disposed on the second side of the substrate and configured to thermally connect the heat dissipating plate to the cooling unit.

7. The solid-state image pickup device according to claim 1,
wherein a plurality of the optical communication units are arranged in a centralized manner outside the pixel unit and along a perimeter of the substrate; and
wherein the substrate is further sandwiched between the cooling unit and the plurality of optical communication units arranged in a centralized manner.

8. The solid-state image pickup device according to claim 1,
wherein a plurality of the optical communication units are arranged separately in a distributed manner outside the pixel unit and along a perimeter of the substrate; and
wherein the substrate is further sandwiched between the cooling unit and the plurality of optical communication units arranged separately in a distributed manner.

9. The solid-state image pickup device according to claim 1,
wherein a plurality of groups of the optical communication units close to each other are arranged in a distributed manner outside the pixel unit and along a perimeter of the substrate; and
wherein the substrate is further sandwiched between the cooling unit and the plurality of groups of optical communication units close to each other, the groups being arranged in a distributed manner.

10. A solid-state image pickup device comprising:
a pixel unit configured to convert light into an electrical signal;
a substrate having a first side on which the pixel unit is formed and a second side opposite the first side;
an optical communication unit laterally disposed side by side with the pixel unit on the first side of the substrate, and configured to convert a signal read out from the pixel unit into an optical signal and output the optical signal;
a cooling unit disposed on the second side of the substrate and configured to cool or dissipate heat generated in the optical communication unit and transferred through the substrate, the substrate being sandwiched between the optical communication unit and at least a portion of the cooling unit; and
an electrode unit disposed on the second side of the substrate and to which power and a control signal for controlling readout of a signal from the pixel unit are supplied,
wherein the cooling unit is disposed on the entire second side of the substrate except a forming position of the electrode unit, the forming position being a position at which the electrode unit is formed.

11. A signal processing system comprising:
an optical apparatus including:
a solid-state image pickup device, and
an optical device that causes light to be incident on the solid-state image pickup device; and
a signal processing apparatus to which the optical apparatus is connected,
wherein the solid-state image pickup device includes:
a pixel unit configured to convert light into an electrical signal;
a substrate having a first side on which the pixel unit is formed and a second side opposite the first side;
an optical communication unit laterally disposed side by side with the pixel unit on the first side of the substrate, and configured to convert a signal read out from the pixel unit into an optical signal and output the optical signal; and
a cooling unit disposed on the second side of the substrate and configured to cool or dissipate heat generated in the optical communication unit and transferred through the substrate, the substrate being sandwiched between the optical communication unit and at least a portion of the cooling unit.

* * * * *